United States Patent
Oyama et al.

(10) Patent No.: US 10,573,512 B2
(45) Date of Patent: Feb. 25, 2020

(54) FILM FORMING METHOD

(71) Applicant: Tokyo Electron Limited, Tokyo (JP)

(72) Inventors: Takeshi Oyama, Yamanashi (JP); Noriaki Fukiage, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 93 days.

(21) Appl. No.: 14/977,861

(22) Filed: Dec. 22, 2015

(65) Prior Publication Data
US 2016/0189950 A1 Jun. 30, 2016

(30) Foreign Application Priority Data

Dec. 24, 2014 (JP) ................................. 2014-259976

(51) Int. Cl.
*H01L 21/02* (2006.01)

(52) U.S. Cl.
CPC ...... *H01L 21/0217* (2013.01); *H01L 21/0228* (2013.01); *H01L 21/02274* (2013.01)

(58) Field of Classification Search
CPC .................... C23C 16/45523; C23C 16/45525
See application file for complete search history.

(56) References Cited

U.S. PATENT DOCUMENTS

| | | | | |
|---|---|---|---|---|
| 6,586,347 B1* | 7/2003 | Liu | ................... | H01L 21/76801 257/758 |
| 2001/0054728 A1* | 12/2001 | Paz de Araujo | ........ | H01L 28/55 257/296 |
| 2003/0235961 A1* | 12/2003 | Metzner | ................... | C23C 16/30 438/287 |
| 2006/0199357 A1* | 9/2006 | Wan | ........ | C23C 16/345 438/482 |
| 2006/0211246 A1 | 9/2006 | Ishizaka et al. | | |
| 2007/0132100 A1* | 6/2007 | Ikeda | ..................... | C23C 14/027 257/751 |
| 2007/0160774 A1* | 7/2007 | Tsukada | ................ | C23C 16/308 427/579 |
| 2007/0238268 A1* | 10/2007 | Leusink | .............. | H01L 21/0214 438/478 |
| 2008/0226939 A1* | 9/2008 | Kubota | ................ | H01L 51/5237 428/690 |
| 2010/0055347 A1* | 3/2010 | Kato | ..................... | C23C 16/452 427/569 |
| 2012/0139062 A1* | 6/2012 | Yuan | ................. | H01L 21/76897 257/411 |

(Continued)

FOREIGN PATENT DOCUMENTS

| JP | 05-047753 A | 2/1993 |
|---|---|---|
| JP | 07-245268 A | 9/1995 |
| JP | 2000-114252 A | 4/2000 |

(Continued)

*Primary Examiner* — Joseph A Miller, Jr.
(74) *Attorney, Agent, or Firm* — Abelman, Frayne & Schwab

(57) ABSTRACT

Disclosed is a method of forming a nitride film on a substrate to be processed ("processing target substrate") having a carbon-containing film that contains a carbon atom. The method includes placing the processing target substrate within a processing container of a film forming apparatus, and forming a first nitride film on the carbon-containing film by plasma of a first reaction gas including a gas of nitride species having no hydrogen atom, and an inert gas.

4 Claims, 17 Drawing Sheets

(56) References Cited

U.S. PATENT DOCUMENTS

2012/0220127 A1* 8/2012 Komatani ......... H01L 29/41725
                                                    438/686
2013/0337635 A1* 12/2013 Yamawaku ....... H01L 21/02104
                                                    438/466

FOREIGN PATENT DOCUMENTS

| JP | 2013-168437 A | 8/2013 |
| WO | 2003-028069 A | 4/2003 |
| WO | 2012-057889 A | 5/2012 |

* cited by examiner

FIG.11

|  | N₂ gas (sccm) / Ar gas (sccm) | | | |
|---|---|---|---|---|
|  | 20/5000 | 20/3000 | 20/1000 | 1000/0 |
| SiN film | 18.6nm | 17.4nm | 20.1nm | 22.5nm |
| Base film | 52.3nm | 54.3nm | 55.4nm | 46.5nm |

*FIG.13*

|  | Power × number of antennae ||||| 
|---|---|---|---|---|---|
|  | 0.5kW × 1 | 1.0kW × 2 | 2.0kW × 1 | 2.0kW × 2 | 4.0kW × 2 |
| SiN film | 16.6nm | 17.4nm | 13.4nm | 18.2nm | 20.1nm |
| Base film | 67.0nm | 55.0nm | 52.5nm | 60.1nm | 55.4nm |

FILM FORMING METHOD

CROSS-REFERENCE TO RELATED APPLICATIONS

This application is based on and claims priority from Japanese Patent Application No. 2014-259976 filed on Dec. 24, 2014 with the Japan Patent Office, the disclosure of which is incorporated herein in its entirety by reference.

TECHNICAL FIELD

Various aspects and exemplary embodiments of the present disclosure relate to a film forming method.

BACKGROUND

When a silicon (Si) substrate is exposed to the atmosphere, a thin natural oxide film is formed on the surface. If the natural oxide film is formed on the silicon substrate, an abnormal growth of a silicon nitride (SiN) film occurs when forming the silicon nitride film on the silicon substrate. In order to prevent this, a technique has been known in which, after the silicon substrate is conveyed to a reactor, a thin base film formed of a silicon oxynitride (SiON)-based thin film having small substrate surface dependence is formed on the silicon substrate, and then, a silicon nitride-based thin film is formed thereon in succession. See, for example, Japanese Patent Laid-Open Publication No. 07-245268.

SUMMARY

According to an aspect, the present disclosure provides a method of forming a nitride film on a substrate to be processed ("processing target substrate") having a carbon-containing film that contains a carbon atom. The method includes placing the processing target substrate within a processing container of a film forming apparatus; and forming a first nitride film on the carbon-containing film by plasma of a first reaction gas and an inert gas, the first reaction gas including a gas of nitride species in which no hydrogen atom is contained.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 11 is a table summarizing test results illustrated in FIGS. 10A to 10D.

FIG. 13 is a table summarizing test results illustrated in FIGS. 12A to 12E.

DETAILED DESCRIPTION

Figure 1:
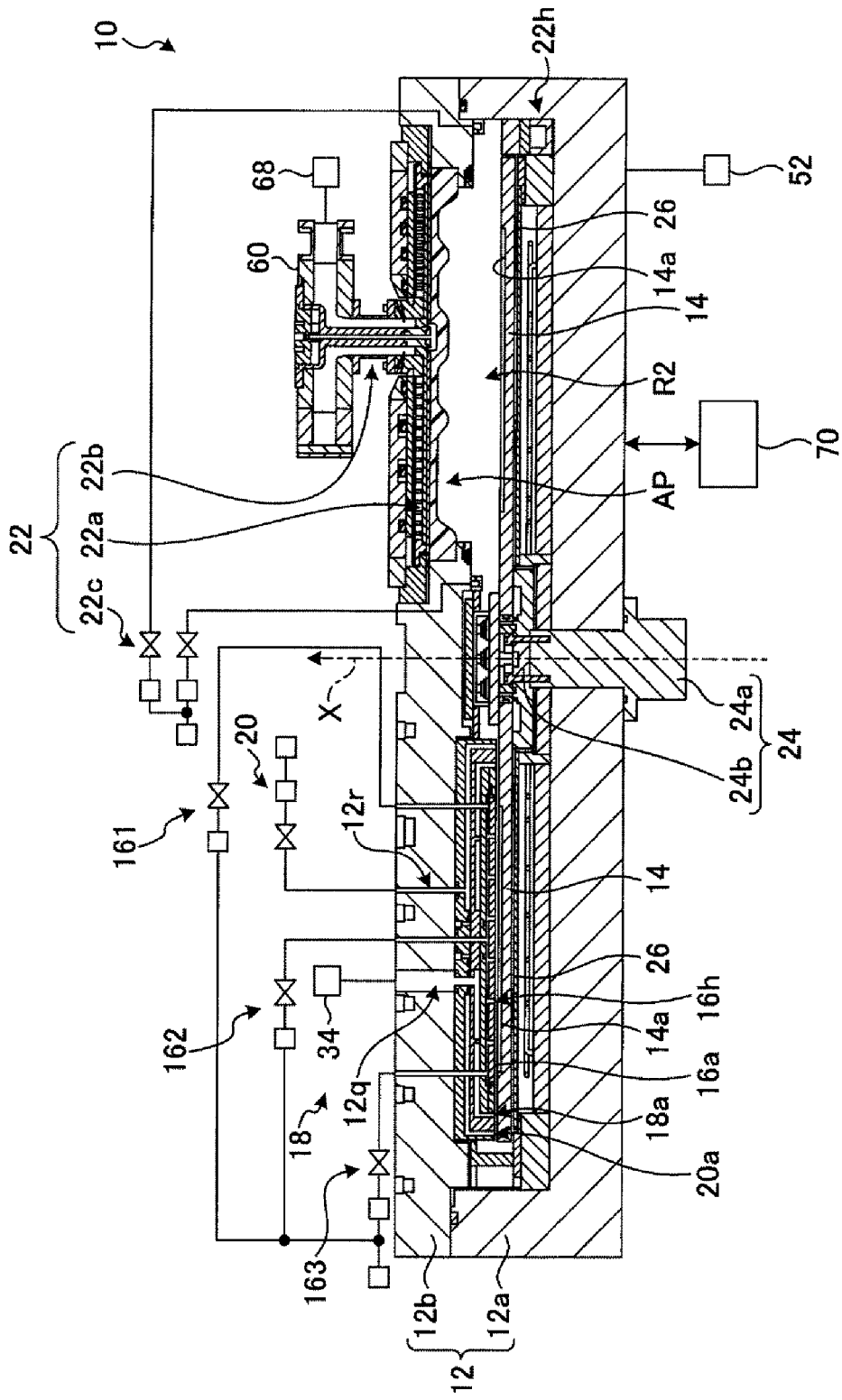
FIG. 1 is a cross-sectional view illustrating an exemplary film forming apparatus.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

When a nitride film is formed on a carbon atom-containing film used as a base film, ions in plasma and carbon atoms contained in the base film may react so that the base film may be decomposed. Thus, it is difficult to form a nitride film having a predetermined thickness on the base film whiling maintaining a thickness of the carbon atom-containing base film. Specifically, when the nitride film is formed on a substrate according to an atomic layer deposition (ALD) method, the base film is in contact with the plasma for a long period of time due to slow film formation speed. Therefore, when a molecule adsorbed onto the surface of the base film is nitrified, unintended reaction may occur between the molecule and the base film. As a result, the decomposition of the base film or the deterioration of the nitride film may occur in some cases.

According to an aspect, the present disclosure provides a method of forming a nitride film on a substrate to be processed ("processing target substrate") having a carbon-containing film that contains a carbon atom. The method includes placing the processing target substrate within a processing container of a film forming apparatus; and forming a first nitride film on the carbon-containing film by plasma of a first reaction gas and an inert gas, the first reaction gas including a gas of nitride species in which no hydrogen atom is contained.

In an exemplary embodiment of the above-mentioned method, the first reaction gas may be a mixed gas of nitrogen ($N_2$) gas and argon (Ar) gas.

In an exemplary embodiment of the above-mentioned method, a ratio of a flow rate of the nitrogen gas to a flow rate of the argon gas may be 1/50 or less.

In an exemplary embodiment of the above-mentioned method, in the forming the first nitride film, the plasma of the first reaction gas may be generated by microwaves supplied from an antenna into the processing container. Power of the microwaves supplied from the antenna into the processing container may be 2 kW or more in total.

In an exemplary embodiment, the above-mentioned method further includes forming a second nitride film on the first nitride film by plasma of a second reaction gas after the forming the first nitride film, the second reaction gas including a gas different from the first reaction gas.

In an exemplary embodiment of the above-mentioned method, the second reaction gas may include a gas of nitride species having a hydrogen atom.

According to another aspect, the present disclosure provides a method of forming a nitride film on a substrate to be processed ("processing target substrate") having a carbon-containing film having a carbon atom. The method includes placing the processing target substrate within a processing container of a film forming apparatus; forming a first nitride film on the carbon-containing film by plasma of a first reaction gas and an inert gas, the first reaction gas including a gas of nitride species in which no hydrogen atom is contained; and forming a second nitride film on the first nitride film by plasma of a second reaction gas after the forming the first nitride film, the second reaction gas including a gas of nitride species having a hydrogen atom. The processing container is divided into a plurality of regions in a circumferential direction where the processing target substrate is moved around an axis by rotating a placing table on which the processing target substrate is placed, the placing table being provided to be rotatable around the axis such that the processing target substrate is moved around the axis. The forming the first nitride film includes: supplying a precursor gas to one of the plurality of regions so that a molecule of the precursor gas is adsorbed onto a surface of the processing target substrate; supplying the first reaction gas to another region among the plurality of regions; generating plasma of the first reaction gas by microwaves supplied to the another region; and performing a plasma processing, by the generated plasma, on the surface of the processing target substrate onto which the molecule of the precursor gas is adsorbed. The forming the second nitride film includes: supplying the precursor gas into the processing container in the one region so that the molecule of the precursor gas is adsorbed onto the surface of the processing target substrate; supplying the second reaction gas into the another region; generating plasma of the second reaction gas by microwaves supplied to the another region; and performing a plasma processing, by the generated plasma, on the surface of the processing target substrate onto which the molecule of the precursor gas is adsorbed.

In an exemplary embodiment of the above-mentioned method, in the first nitride film formation step, the first nitride film may be formed by an atomic layer deposition (ALD) method.

In an exemplary embodiment of the above-mentioned method, the first nitride film may be formed on the carbon-containing film in a thickness of 0.5 nm to 1.0 nm.

According to various aspects and exemplary embodiments of the present disclosure, a film having a predetermined thickness may be formed on the base film while suppressing reduction in film thickness of the carbon atom-containing base film.

Exemplary Embodiment

Figure 2:
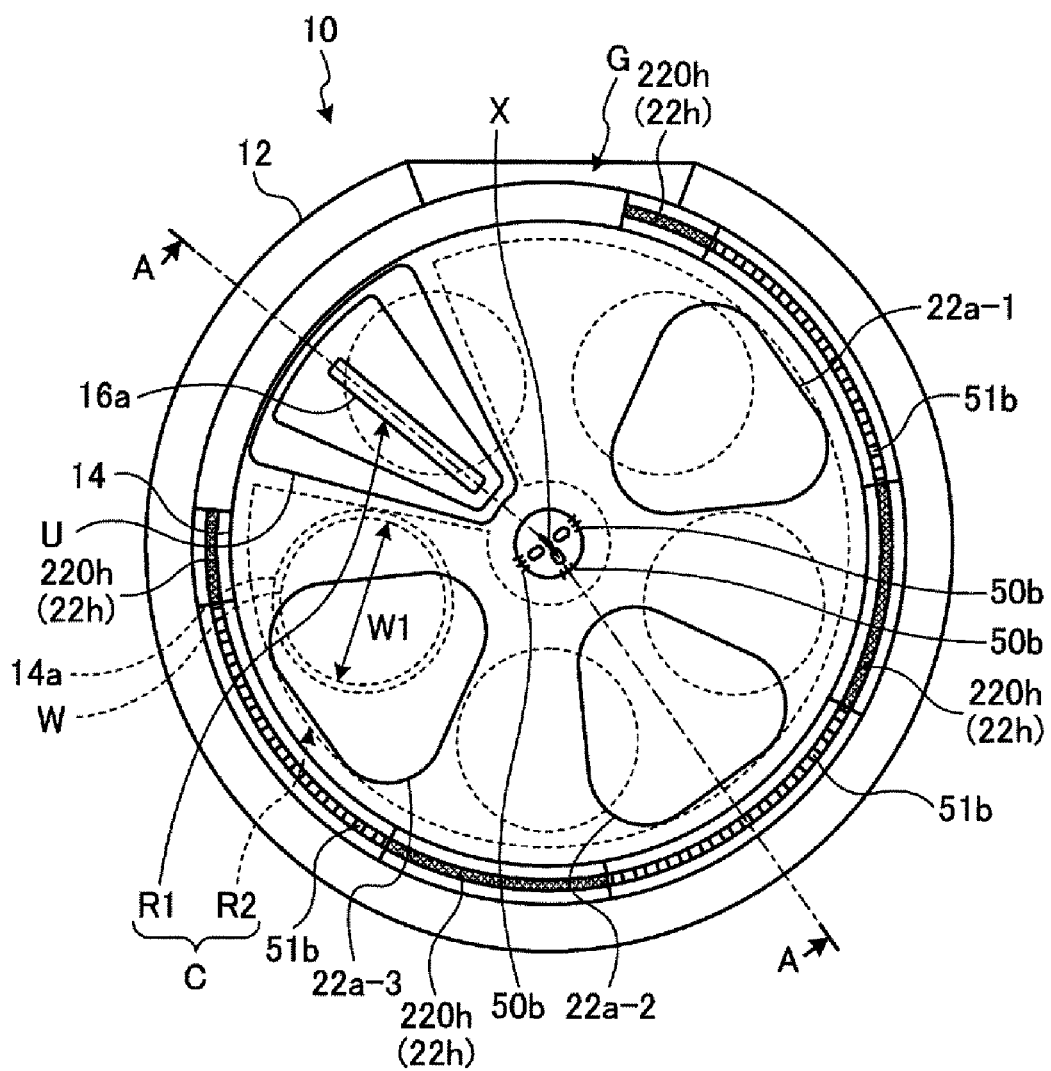
FIG. 2 is a schematic view illustrating the exemplary film forming apparatus when viewed from the top.
Figure 3:
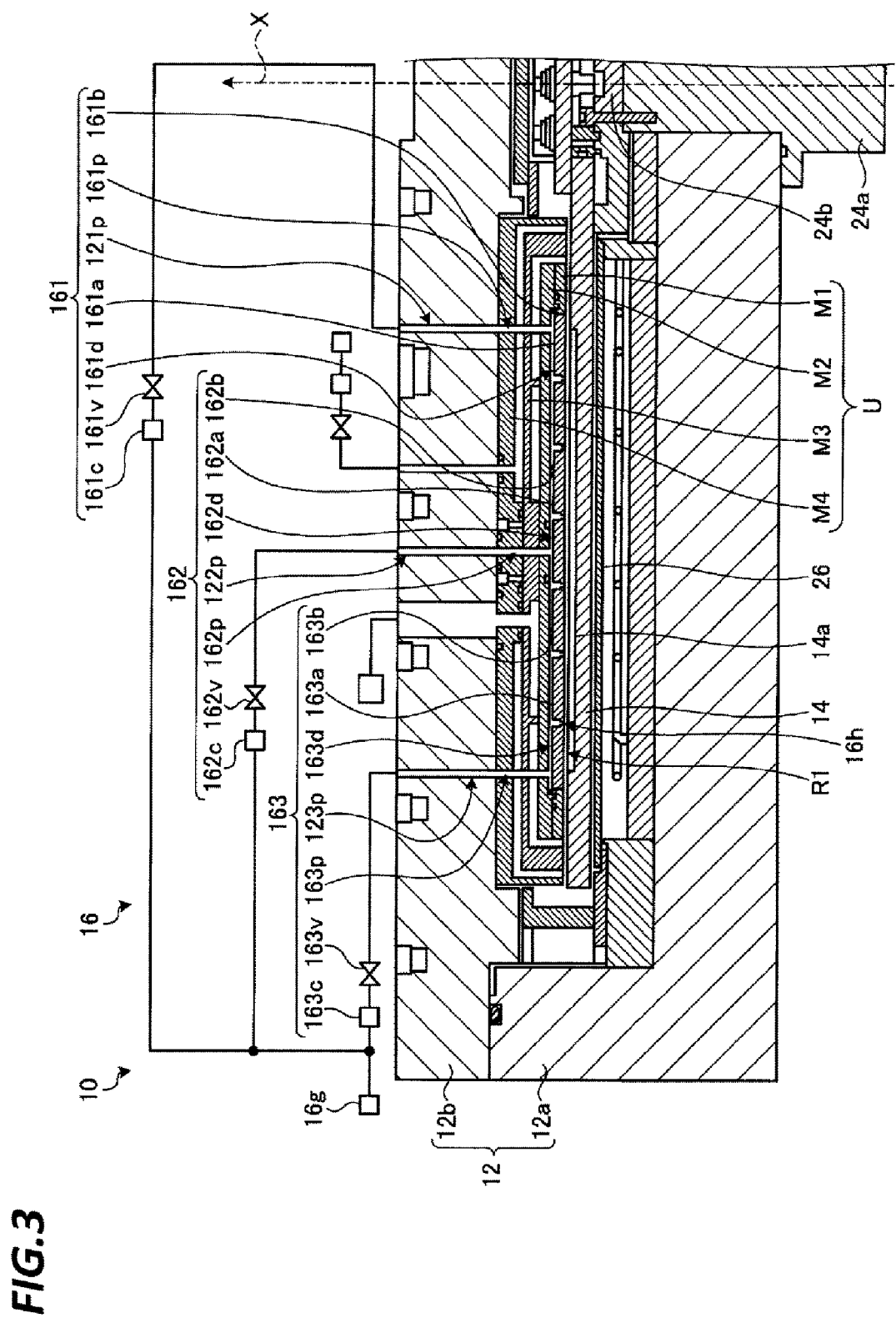
FIG. 3 is an enlarged cross-sectional view illustrating an example of a portion at the left side of an axis X in FIG. 1.
Figure 4:
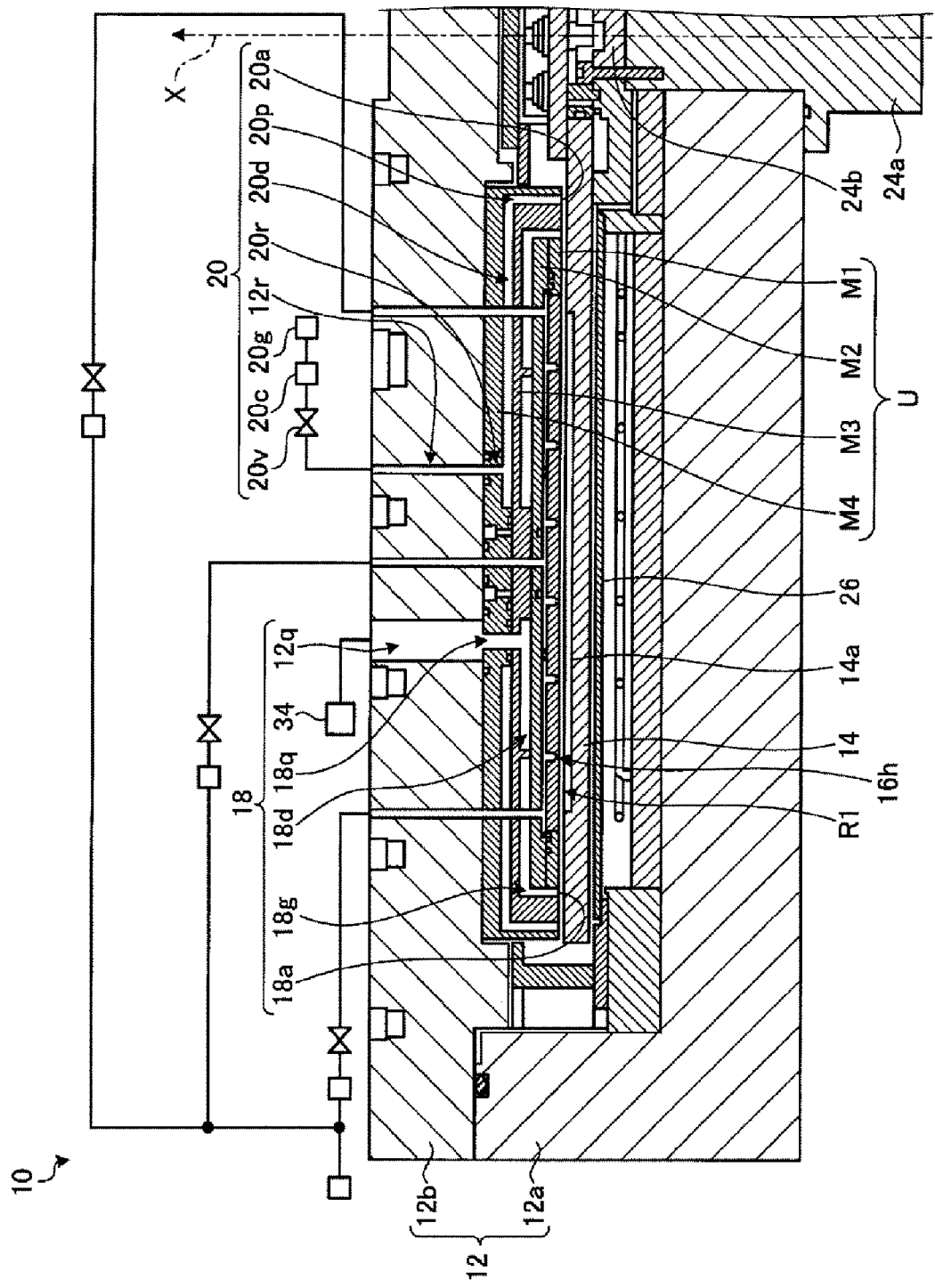
FIG. 4 is an enlarged cross-sectional view illustrating another example of the portion at the left side of the axis X in FIG. 1.
Figure 5:
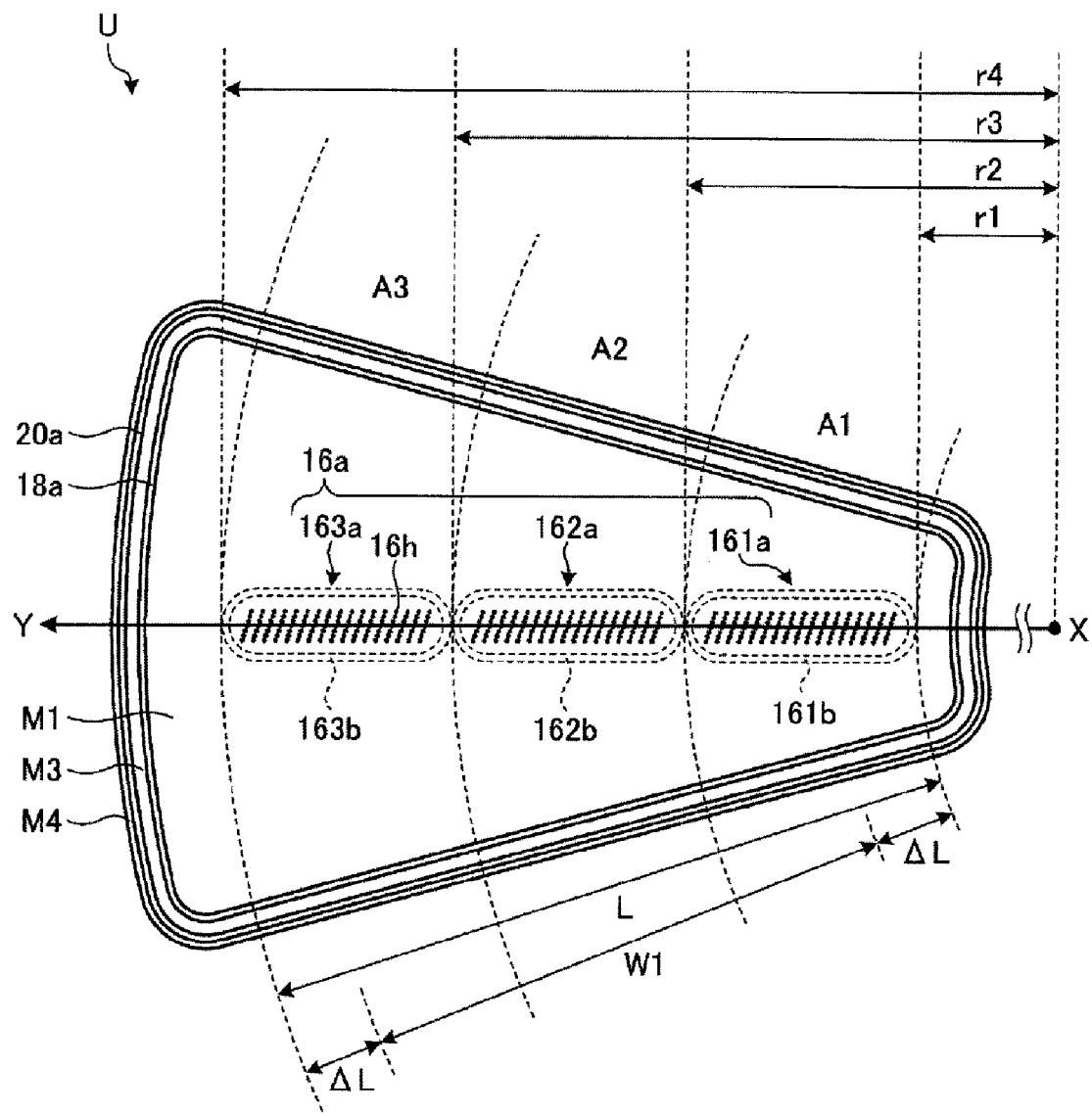
FIG. 5 is a view illustrating an example of a bottom surface of a unit U.
Figure 6:
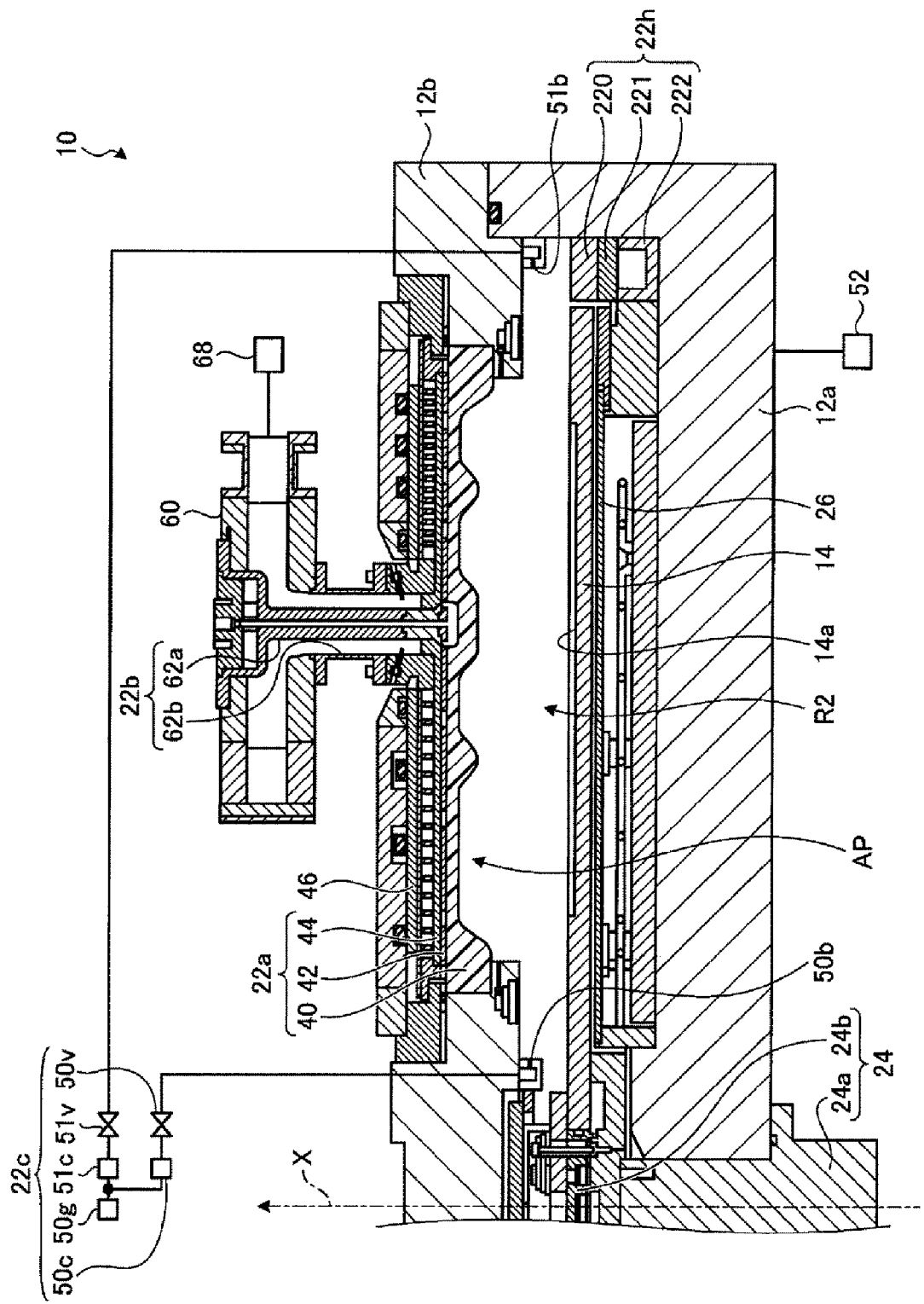
FIG. 6 is an enlarged cross-sectional view illustrating an example of a portion at the right side of the axis X in FIG. 1.

FIG. 1 is a cross-sectional view illustrating an exemplary film forming apparatus 10. FIG. 2 is a schematic view illustrating the film forming apparatus 10 when viewed from the top. A cross-section taken along line A-A in FIG. 2 corresponds to FIG. 1. FIGS. 3 and 4 are enlarged cross-sectional views illustrating an example of a portion at the left side of an axis X in FIG. 1. FIG. 5 is a view illustrating an example of a bottom surface of a unit U. FIG. 6 is an enlarged cross-sectional view illustrating an example of a portion at the right side of the axis X in FIG. 1. The film forming apparatus 10 includes, mainly, a processing container 12, a placing table 14, a first gas supply section 16, an exhaust section 18, a second gas supply section 20, and a plasma generating section 22.

As illustrated in FIG. 1, the processing container 12 is provided with a lower member 12a and an upper member 12b. The lower member 12a has a substantially cylindrical shape that is top-opened, and forms a recess including a sidewall and a bottom wall, which define a processing chamber C. The upper member 12b is a cover body having a substantially cylindrical shape, and defines the processing chamber C by covering the top opening of the recess of the lower member 12a. In an outer peripheral portion between the lower member 12a and the upper member 12b, an elastic sealing member, for example, an O-ring is provided to seal the processing chamber C.

The film forming apparatus 10 includes the placing table 14 inside the processing chamber C defined by the processing container 12. The placing table 14 is rotationally driven around an axis X by a driving mechanism 24. The driving mechanism 24 is provided with a driving device 24a such as, for example, a motor, and a rotation shaft 24b, and is attached to the lower member 12a of the processing container 12.

The rotation shaft 24b extends to the inside of the processing chamber C with the axis X as a central axis. The rotation shaft 24b is rotated around the axis X by a driving force transmitted from the driving device 22a. The central portion of the placing table 14 is supported by the rotation shaft 24b. Accordingly, the placing table 14 is rotated around the axis X as the rotation shaft 24b is rotated. Further, an elastic sealing member such as, for example, an O-ring is provided between the lower member 12a of the processing container 12 and the driving mechanism 24 to seal the processing chamber C.

The film forming apparatus 10 includes a heater 26 below the placing table 14 inside the processing chamber C to heat a substrate W, which is a processing target substrate, placed on the placing table 14. Specifically, the heater 26 heats the substrate W by heating the placing table 14.

For example, as illustrated in FIG. 2, the processing container 12 is a substantially cylindrical container with the axis X as a central axis, and includes the processing chamber C defined therein. The processing chamber C is provided with a unit U including an injection part 16a. The processing container 12 is formed of a metal such as, for example, aluminum (Al) the inner surface of which is subjected to, for example, an alumite treatment or a spray treatment of yttrium oxide ($Y_2O_3$). The film forming apparatus 10 includes a plurality of plasma generating sections 22 within the processing container 12.

Each plasma generating section 22 is provided with a plurality of antennae 22a-1 to 22a-3 that output microwaves, in an upper portion of the processing container 12. In the present exemplary embodiment, each antenna 22a has an external appearance of a substantially triangular shape with rounded corners. In FIG. 2, three antennae 22a-1 to 22a-3 are provided in the upper portion of the processing container 12. However, the number of the antennae 22a is not limited thereto, and may be two or less, or four or more.

For example, as illustrated in FIG. 2, the film forming apparatus 10 includes the placing table 14 provided with a plurality of substrate placing regions 14a on its top surface. The placing table 14 is a substantially disc-shaped member with the axis X as a central axis. On the top surface of the placing table 14, a plurality of (five in the example of FIG. 2) substrate placing regions 14a, on which the substrate W is placed, are formed concentrically around the axis X. The substrate W is disposed in a substrate placing region 14a, and the substrate placing region 14a supports the substrate such that the substrate is not dislocated when the placing table 14 is rotated. The substrate placing region 14a is a substantially circular recess, which is substantially the same shape as the substantially circular substrate W. The diameter of the recess of the substrate placing region 14a is substantially the same as the diameter W1 of the substrate W placed on the substrate placing region 14a. That is, the diameter of the recess of the substrate placing region 14a may be set such that the placed substrate W is fitted in the recess and the substrate W is fixed so as not to be moved from the fitted position by a centrifugal force even when the placing table 14 is rotated.

The film forming apparatus 10 includes a gate valve G at the outer periphery of the processing container 12. The gate valve G is configured to allow the substrate W to be carried into and out of the processing chamber C therethrough, using a conveyance device such as, for example, a robot arm. Further, the film forming apparatus 10 includes an exhaust section 22h along the peripheral edge of the placing table 14, below the outer periphery of the placing table 14. The exhaust section 22h is connected with an exhaust device 52. The film forming apparatus 10 maintains the pressure in the processing chamber C at a target pressure by controlling the operation of the exhaust device 52 to exhaust a gas in the processing chamber C from an exhaust port.

For example, as illustrated in FIG. 2, the processing chamber C includes a first region R1 and a second region R2 which are arranged on the circumference around the axis X. The substrate W placed on the substrate placing region 14a sequentially passes through the first region R1 and the second region R2 while the placing table 14 is rotated. In the present exemplary embodiment, the placing table 14 illustrated in FIG. 2 is rotated, for example, clockwise when viewed from the top.

For example, as illustrated in FIGS. 3 and 4, the first gas supply section 16 includes an inner gas supply section 161, an intermediate gas supply section 162, and an outer gas supply section 163. Further, for example, as illustrated in FIGS. 3 and 4, the unit U that performs supply, purge, and exhaust of gas is provided above the first region R1 to face the top surface of the placing table 14. The unit U has a structure in which a first member M1, a second member M2, a third member M3, and a fourth member M4 are sequentially stacked. The unit U is attached to the processing container 12 to abut onto the bottom surface of the upper member 12b of the processing container 12.

For example, as illustrated in FIGS. 3 and 4, the unit U includes a gas supply path 161p, a gas supply path 162p, and a gas supply path 163p, which pass through the second to fourth members M2 to M4. The upper end of the gas supply path 161p is connected to a gas supply path 121p provided in the upper member 12b of the processing container 12. The gas supply path 121p is connected with a gas supply source 16g of the precursor gas via a valve 161v and a flow rate controller 161c such as, for example, a mass flow controller. Further, the lower end of the gas supply path 161p is formed between the first member M1 and the second member M2, and connected to a buffer space 161d that is surrounded by an elastic member 161b such as, for example, an O-ring. The buffer space 161d is connected with an injection port 16h of an inner injection part 161a provided in the first member M1.

Further, the upper end of the gas supply path 162p is connected to a gas supply path 122p provided in the upper member 12b of the processing container 12. The gas supply path 122p is connected with the gas supply source 16g via a valve 162v and a flow rate controller 162c. Further, the lower end of the gas supply path 162p is formed between the first member M1 and the second member M2, and connected to a buffer space 162d that is surrounded by an elastic member 162b such as, for example, an O-ring. The buffer space 162d is connected with an injection port 16h of an intermediate injection part 162a provided in the first member M1.

Further, the upper end of the gas supply path 163p is connected to a gas supply path 123p provided in the upper member 12b of the processing container 12. The gas supply path 123p is connected with the gas supply source 16g via a valve 163v and a flow rate controller 163c. Further, the lower end of the gas supply path 163p is formed between the first member M1 and the second member M2, and connected to a buffer space 163d that is surrounded by an elastic member 163b such as, for example, an O-ring. The buffer space 163d is connected with an injection port 16h of an outer injection part 163a provided in the first member M1.

For example, as illustrated in FIGS. 3 and 4, the buffer space 161d of the inner gas supply section 161, the buffer space 162d of the intermediate gas supply section 162, and the buffer space 163d of the outer gas supply section 163 form an independent space, respectively. In addition, the flow rates of the precursor gas passing through the respective buffer spaces are independently controlled by the flow rate controller 161c, the flow rate controller 162c, and the flow rate controller 163c, respectively.

For example, as illustrated in FIGS. 3 and 4, the unit U includes a gas supply path 20r formed to penetrate through the fourth member M4. The upper end of the gas supply path 20r is connected to a gas supply path 12r provided in the upper member 12b of the processing container 12. The gas supply path 20r is connected with a gas supply source 20g of the purge gas via a valve 20v and a flow rate controller 20c.

The lower end of the gas supply path 20r is connected to a space 20d provided between the bottom surface of the fourth member M4 and the top surface of the third member M3. Further, the fourth member M4 includes a recess formed to accommodate the first to third members M1 to M3. A gap 20p is provided between the inner surface of the fourth member M4, which forms the recess, and the outer surface of the third member M3. The gap 20p is connected to the space 20d. The lower end of the gap 20p serves as an injection port 20a.

For example, as illustrated in FIGS. 3 and 4, the unit U includes an exhaust path 18q formed to penetrate through the third member M3 and the fourth member M4. The upper end of the exhaust path 18q is connected to an exhaust path 12q provided in the upper member 12b of the processing container 12. The exhaust path 12q is connected to the exhaust device 34 such as, for example, a vacuum pump. Further, the exhaust path 18q is connected to a space 18d provided between the bottom surface of the third member M3 and the top surface of the second member M2. The third member M3 is provided with a recess that accommodates the first member M1 and the second member M2. A gap 18g is provided between the inner surface of the third member M3, which constitutes the recess provided in the third member M3, and the outer surface of the second member M2. The space 18d is connected to the gap 18g. The lower end of the gap 18g serves as an exhaust port 18a.

For example, as illustrated in FIG. 5, the injection part 16a is provided along a Y-axis direction away from the axis X, on the bottom surface of the unit U, that is, a surface that faces the placing table 14. Among the regions included in the processing chamber C, the region that faces the injection part 16a corresponds to the first region R1. The injection part 16a injects the precursor gas toward the substrate W on the placing table 14. For example, as illustrated in FIG. 5, the injection part 16a includes an inner injection part 161a, an intermediate injection part 162a, and an outer injection part 163a.

For example, as illustrated in FIG. 5, the inner injection part 161a is formed in an inner annular region A1 that is a region included in the bottom surface of the unit U among annular regions where the distance from the axis X is in a range of r1 to r2. Further, the intermediate injection part 162a is formed in an intermediate annular region A2 that is a region included in the bottom surface of the unit U among annular regions where the distance from the axis X is in a range of r2 to r3. Further, the outer injection part 163a is formed in an outer annular region A3 that is a region included in the bottom surface of the unit U among annular regions where the distance from the axis X is in a range of r3 to r4.

For example, as illustrated in FIG. 5, a length L from r1 to r4, which is a range where the injection part 16a formed on the bottom surface of the unit U extends in the Y-axis direction, is a predetermined distance $\Delta L$ or more longer in the axis X side direction and the predetermined distance $\Delta L$ or more longer in a direction opposite to the axis X side than a distance where the substrate W of the diameter W1 passes through the Y-axis.

For example, as illustrated in FIG. 5, the inner injection part 161a, the intermediate injection part 162a, and the outer injection part 163a include a plurality of injection ports 16h. The precursor gas is injected to the first region R1 from the respective injection ports 16h. The flow rates of the precursor gas injected from the respective injection ports 16h of the inner injection part 161a, the intermediate injection part 162a, and the outer injection part 163a to the first region R1 are independently controlled by the flow rate controller 161c, the flow rate controller 162c, and the flow rate controller 163c, respectively. As the precursor gas is supplied to the first region R1, the atoms or molecules of the precursor gas are adsorbed onto the surface of the substrate W that has passed through the first region R1. The precursor gas includes a silicon atom-containing gas such as, for example, dichlorosilane (DCS), monochlorosilane, trichlorosilane, or hexachlorosilane.

Above the first region R1, for example, as illustrated in FIGS. 3 and 4, an exhaust port 18a of the exhaust section 18 is provided to face the top surface of the placing table 14. For example, as illustrated in FIG. 5, the exhaust port 18a is formed in the bottom surface of the unit U to surround the injection part 16a. The exhaust section 18 exhausts a gas in the processing chamber C through the exhaust port 18a by the operation of the exhaust device 34 such as, for example, a vacuum pump.

Above the first region R1, for example, as illustrated in FIGS. 3 and 4, an injection port 20a of the second gas supply section 20 is provided to face the top surface of the placing table 14. For example, as illustrated in FIG. 5, the injection port 20a is formed in the bottom surface of the unit U to surround the exhaust port 18a. The second gas supply section 20 injects the purge gas to the first region R1 through the injection port 20a. The purge gas injected by the second gas supply section 20 is an inert gas such as, for example, argon (Ar). As the purge gas is injected to the surface of the substrate W, atoms or molecules of the precursor gas that are excessively adsorbed onto the substrate W (residual gas components) are removed. Therefore, an atomic layer or molecular layer, in which the atoms or molecules of the precursor gas is adsorbed, is formed on the surface of the substrate W.

The unit U injects the purge gas from the injection port 20a and exhausts the purge gas from the exhaust port 18a along the surface of the placing table 14. Accordingly, the unit U suppresses the precursor gas supplied to the first region R1 from leaking out from the first region R1. Further, the unit U suppresses the reaction gas or the radicals of the reaction gas supplied to the second region R2 from entering into the first region R1 by ejecting the purge gas from the injection port 20a and exhausting the purge gas from the exhaust port 18a along the surface of the placing table 14.

That is, the unit U separates the first region R1 and the second region R2 by the injection of the purge gas from the second gas supply section 20 and the exhaust of the purge gas from the exhaust section 18.

For example, as illustrated in FIG. 6, the film forming apparatus 10 includes a plasma generating section 22 in an opening AP of the upper member 12b located above the second region R2. The plasma generating section 22 is provided to face the top surface of the placing table 14. The plasma generating section 22 includes an antenna 22a, a coaxial waveguide 22b that supplies microwaves to the antenna 22a, and a reaction gas supply section 22c that supplies the reaction gas to the second region R2. In the present exemplary embodiment, for example, three openings AP are formed in the upper member 12b, and the film forming apparatus 10 includes, for example, three antennae 22a-1 to 22a-3.

The plasma generating section 22 generates plasma of the reaction gas in the second region R2 by supplying microwaves from the antenna 22a and the coaxial waveguide 22b to the second region R2 and supplying the reaction gas from the reaction gas supply section 22c to the second region R2. Then, the plasma generating section 22 performs a plasma processing on the atomic layer or molecular layer adsorbed on the surface of the substrate W. In the present exemplary embodiment, a gas containing nitrogen atoms and hydrogen atoms is used as the reaction gas, and the plasma generating section 22 nitrifies the atomic layer or molecular layer adsorbed on the substrate W. The reaction gas may be, for example, a mixed gas of nitrogen ($N_2$) gas and hydrogen ($H_2$) gas, or a mixed gas of ammonia ($NH_3$) gas and $H_2$ gas.

For example, as illustrated in FIG. 6, in the plasma generating section 22, the antenna 22a is air-tightly arranged to close the opening AP. The antenna 22a includes a top plate 40, a slot plate 42, and a slow-wave plate 44. The top plate 40 is a member in a substantially equilateral triangle shape with rounded corners, which is made of a dielectric such as, for example, alumina ceramics. The top plate 40 is supported by the upper member 12b such that its bottom surface is exposed from the opening AP formed in the upper member 12b of the processing container 12 to the second region R2.

The slot plate 42 is provided on the top surface of the top plate 40. The slot plate 42 is a plate-like metal member which is formed in a substantially equilateral triangle shape. The slot plates 42 includes a plurality of slot pairs. Each slot pair includes two slot holes that are orthogonal to each other.

The slow-wave plate 44 is provided on the top surface of the slot plate 42. The slow-wave plate 44 is formed of a dielectric such as, for example, alumina ceramics, in a substantially equilateral triangle shape. The slow-wave plate 44 includes a substantially cylindrical opening to arrange an outer conductor 62b of the coaxial waveguide 22b.

A metal cooling plate 46 is provided on the top surface of the slow-wave plate 44. The cooling plate 46 cools the antenna 22a by a coolant flowing through a flow path formed therein, through the slow-wave plate 44. The cooling plate 46 is pressed against the top surface of the slow-wave plate 44 by a spring (not illustrated), so that the bottom surface of the cooling plate 46 is in close contact with the top surface of the slow-wave plate 44.

The coaxial waveguide 22b includes an inner conductor 62a and the outer conductor 62b. The inner conductor 62a penetrate through the opening of the slow-wave plate 44 and the opening of the slot plate 42 from the upper side of the antenna 22a. The outer conductor 62b is provided to surround the inner conductor 62a with a gap between the outer peripheral surface of the inner conductor 62a and the inner peripheral surface of the outer conductor 62b. The lower end of the outer conductor 62b is connected to the opening of the cooling plate 46. Further, the antenna 22a may function as an electrode. Alternatively, an electrode provided in the processing container 12 may be used as the antenna 22a.

The film forming apparatus 10 includes a waveguide 60 and a microwave generator 68. The microwaves of, for example, about 2.45 GHz, which are generated by the microwave generator 68, are propagated to the coaxial waveguide 22b through the waveguide 60, and propagated through the gap between the inner conductor 62a and the outer conductor 62b. Then, the microwaves propagated into the slow-wave plate 44 are propagated from the slot holes of the slot plate 42 to the top plate 40, and radiated from the top plate 40 to the second region R2.

In the second region R2, the reaction gas is supplied from the reaction gas supply section 22c. The reaction gas supply section 22c includes a plurality of inner injection ports 50b and a plurality of outer injection ports 51b, for example, as illustrated in FIG. 2. For example, as illustrated in FIG. 6, each inner injection port 50b is connected to a gas supply source 50g of the reaction gas via a valve 50v and a flow rate controller 50c such as, for example, a mass flow controller. For example, as illustrated in FIG. 6, each inner injection port 50b is provided in the bottom surface of the upper member 12b of the processing container 12.

Each inner injection port 50b injects the reaction gas, which is supplied from the gas supply source 50g through the valve 50v and the flow rate controller 50c, to the second region R2 below the antenna 22a in, for example, a direction parallel to the surface of the substrate W placed on the substrate placing region 14a of the placing table 14 as a direction far away from the axis X.

Each outer injection port 51b is connected to the gas supply source 50g of the reaction gas via a valve 51v and a flow rate controller 51c such as a mass flow controller. For example, as illustrated in FIG. 6, each outer injection port 51b is provided in the bottom surface of the upper member 12b of the processing container 12. Each outer injection port 51b injects the reaction gas, which is supplied from the gas supply source 50g through the valve 51v and the flow rate controller 51c, in, for example, a direction parallel to the surface of the substrate W placed on the substrate placing region 14a of the placing table 14 as a direction approaching the axis X.

Further, in the present exemplary embodiment, the flow rates of the reaction gas injected from the inner injection ports 50b and the outer injection ports 51b are independently controlled by the flow rate controller 50c and the flow rate controller 51c, respectively. Further, the flow rate controller 50c and the flow rate controller 51c may be provided in every antenna 22a, and the flow rates of the reaction gas injected from the inner injection ports 50b and the outer injection ports 51b may be independently controlled in every antenna 22a.

The plasma generating section 22 supplies the reaction gas to the second region R2 by the plurality of inner injection ports 50b and the plurality of outer injection ports 51b and radiates the microwaves to the second region R2 by the antenna 22a. Accordingly, the plasma generating section 22 generates the plasma of the reaction gas in the second region R2.

For example, as illustrated in FIG. 2, the exhaust section 22h is provided in the peripheral edge of the placing table 14. For example, as illustrated in FIG. 6, the exhaust section 22h includes a top-opened groove 222, and a cover 221 provided in the upper portion of the groove 222. The groove 222 is connected to the exhaust device 52. For example, as illustrated in FIG. 2, the cover 221 includes a plurality of exhaust holes in exhaust regions 220h.

Further, a spacer 220 is provided on the cover 221 below the outer injection ports 51b. For example, as illustrated in FIG. 6, the spacer 220 has a thickness that is substantially the same as the height from the top surface of the cover 221 to the top surface of the placing table 14. The spacer 220 suppresses increase in flow speed of the gas caused by a difference in level between the placing table 14 and the cover 221, below the outer injection ports 51b.

In the respective exhaust region 220h, the exhaust section 22h exhausts the gas in the processing chamber C from the plurality of exhaust holes provided in the cover 221 through the groove 222 by the operation of the exhaust device 52. In addition, as for the exhaust holes provided in the cover 221, the position, size, and number of the exhaust holes provided in the respective exhaust regions 220h are adjusted such that the exhaust amounts from the respective exhaust regions become substantially equal.

For example, as illustrated in FIG. 1, the film forming apparatus 10 includes a controller configured to control respective components of the film forming apparatus 10. The controller 70 may be a computer including a control device such as a central processing unit (CPU), a storage device such as a memory, and an input/output device. The controller 70 controls the respective components of the film forming apparatus 10 by the operation of the CPU according to a control program stored in the memory.

The controller 70 transmits a control signal that controls the rotation speed of the placing table 14, to the driving device 24a. Further, the controller 70 transmits a control signal that controls the temperature of the substrate W, to a power source connected to the heater 26. Further, the controller 70 transmits a control signal that controls the flow rate of the precursor gas, to the valves 161v to 163v and the flow rate controllers 161c to 163c. Further, the controller 70 transmits a control signal that controls the exhaust amount of the exhaust device 34 connected to the exhaust port 18a, to the exhaust device 34.

Further, the controller 70 transmits a control signal that controls the flow rate of the purge gas, to the valve 20v and the flow rate controller 20c. Further, the controller 70 transmits a control signal that controls the transmission power of the microwaves, to the microwave generator 68. Further, the controller 70 transmits a control signal that controls the flow rate of the reaction gas, to the valve 50v, the valve 51v, the flow rate controller 50c, and the flow rate controller 51c. Further, the controller 70 transmits a control signal that controls the exhaust amount from the exhaust section 22h, to the exhaust device 52.

By the film forming apparatus 10 configured as described above, the precursor gas from the first gas supply section 16 is injected onto the substrate W that is moving by the rotation of the placing table 14, and an excessively adsorbed precursor gas is removed from the substrate W by the second gas supply section 20. Then, the substrate W that is moving by the rotation of the placing table 14 is exposed to the plasma of the reaction gas, which is generated by the plasma generating section 22. As the above-described operations are performed repeatedly on the substrate W by the rotation of the placing table 14, the film forming apparatus 10 forms a film having a predetermined thickness on the substrate W.

Examples

In the following, a test was performed in which a conductive film was formed using the film forming apparatus 10 described with reference to FIGS. 1 to 6 by forming a silicon nitride (SiN) film as a nitride film on a carbon atom-containing base substrate, in a thickness of, for example, about 20 nm, and depositing, for example, platinum on the silicon nitride film. The base film is an example of the carbon-containing film.

Figure 7A:
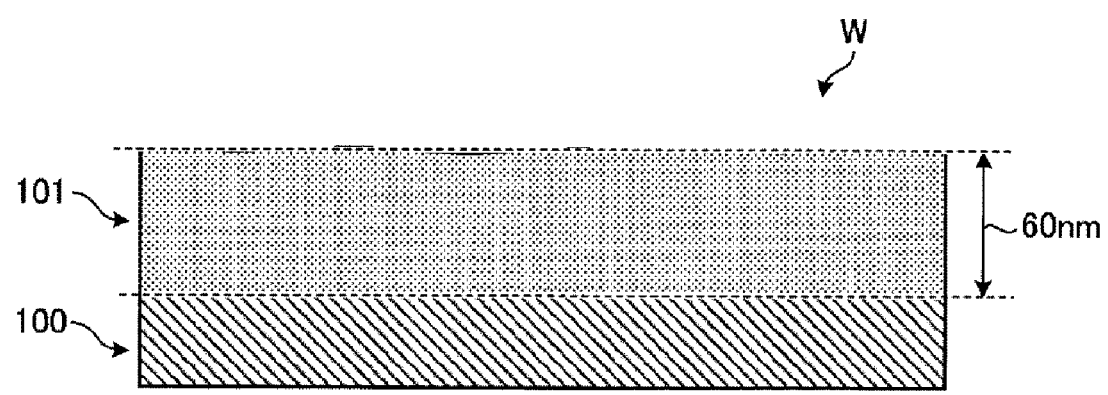
FIG. 7A is a schematic view illustrating an exemplary cross-section of a substrate before a film forming processing is performed.
Figure 7B:
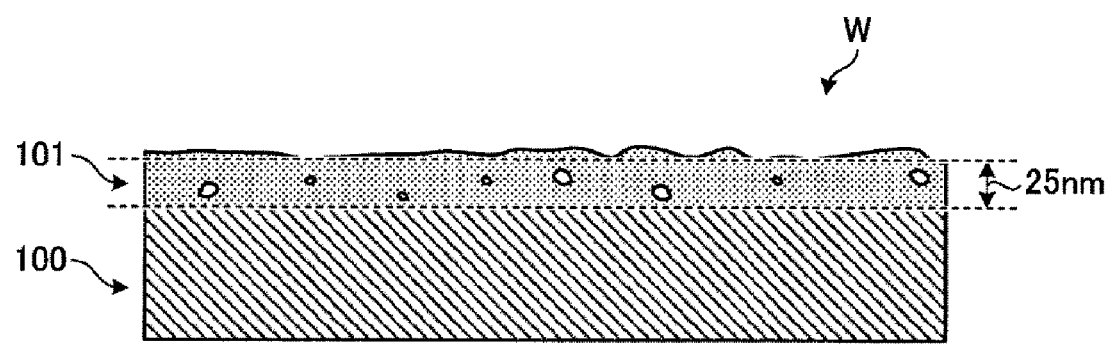
FIG. 7B is a schematic view illustrating an exemplary cross-section of the substrate in a case where the film forming processing is performed using a mixed gas of ammonia ($NH_3$) gas and hydrogen ($H_2$) gas.

First, a test was performed in which the silicon nitride film was formed on the base film by using DCS as a precursor gas and using a mixed gas of ammonia ($NH_3$) gas and hydrogen ($H_2$) gas as reaction gas. The ammonia gas is an example of the gas of nitride species having a hydrogen atom. FIG. 7A is a schematic view illustrating an exemplary cross-section of a substrate W before a film forming processing is performed. FIG. 7B is a schematic view illustrating an exemplary cross-section of the substrate W in a case where the film forming processing is performed using a mixed gas of ammonia gas and hydrogen gas.

In the film forming processing of the silicon nitride film in the test, as illustrated in FIG. 7A, the substrate W was used. The substrate W was formed with a carbon atom-containing base film 101 on a base substrate 100 such as, for example, silicon substrate, in a thickness of about 60 nm. When the film forming processing was performed using the mixed gas of ammonia gas and hydrogen gas as the reaction gas, a silicon nitride film was not formed on the base film 101, as illustrated in FIG. 7B. Further, as illustrated in FIG. 7B, the thickness of the base film 101 after the film forming processing was decreased to about 25 nm, and cavities were generated therein. Based on this, it is considered that the hydrogen atoms contained in plasma of the reaction gas and the carbon atoms contained in the base film 101 reacted to decompose the base film 101.

Figure 8A:
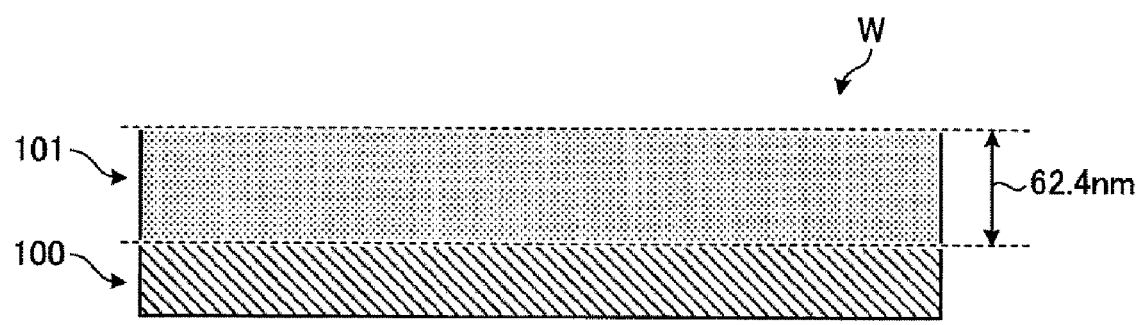
FIG. 8A is a schematic view illustrating an exemplary cross-section of a substrate before the film forming processing is performed.
Figure 8B:
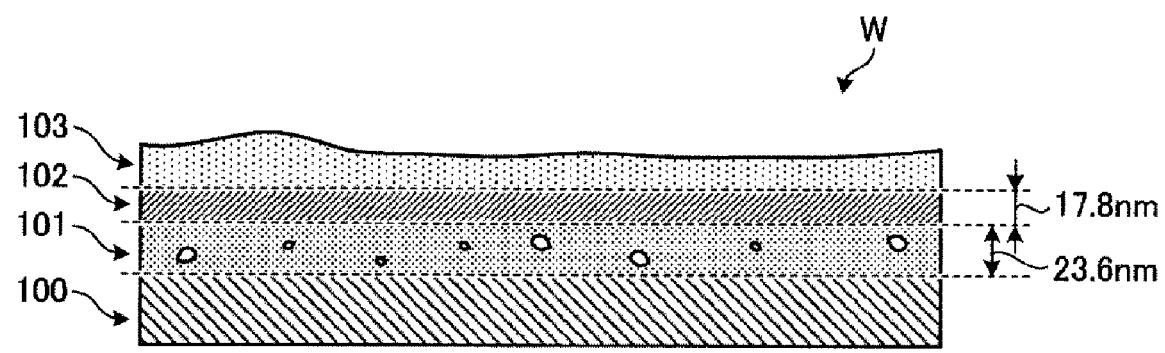
FIG. 8B is a schematic view illustrating an exemplary cross-section of the substrate in a case where the film forming processing is performed using ammonia gas.

Next, a test was performed in which a silicon nitride film was performed on a base film by using DCS as the precursor gas and using ammonia gas only as the reaction gas. FIG. 8A is a schematic view illustrating an exemplary cross-section of a substrate W before the film forming processing is performed. FIG. 8B is a schematic view illustrating an exemplary cross-section of the substrate W in a case where the film forming processing is performed using ammonia gas.

In the film forming processing in the test, as illustrated in FIG. 8A, the substrate W formed with a base film 101 of a thickness of about 62.4 nm on a base substrate 100 was used. Further, DCS was used as the precursor gas. When the film forming processing was performed using ammonia gas only as the reaction gas, a silicon nitride film 102 having a thickness of about 17.8 nm was formed on the base film 101, as illustrated in FIG. 8B. Since the silicon nitride film 102 was formed, a conductor film 103 was formed on the silicon nitride film 102.

In the test, however, as illustrated in FIG. 8B, the thickness of the base film 101 after the film forming processing was decreased considerably from about 62.4 nm to about 23.6 nm, and cavities were generated inside the base film 101 as well. In addition, cavities were observed between the base film 101 and the base substrate 100. Thus, it is considered that due to this, adhesion between the base film 101 and the base substrate 100 was lowered, and the base film 101 was easily peeled off from the base substrate 100.

Based on this, it is considered that since the ammonia gas also contains hydrogen atoms, the hydrogen atoms contained in plasma of the ammonia gas and the carbon atoms contained in the base film 101 reacted to decompose the base film 101. Accordingly, when ammonia gas is used alone as the reaction gas, the silicon nitride film 102 may be formed on the carbon atom-containing base film 101, but the base film 101 may be given considerable damage such as, for example, reduction in film thickness of the base film 101 or generation of cavities.

Figure 9:
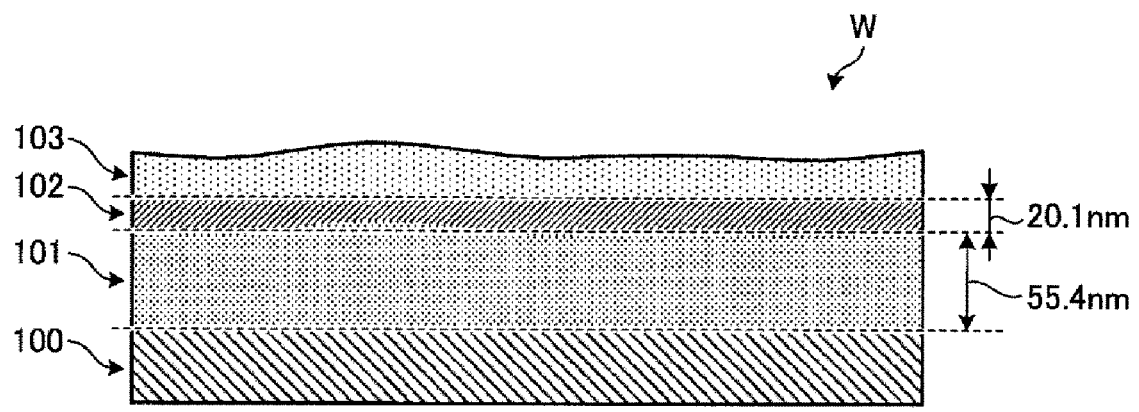
FIG. 9 is a schematic view illustrating an exemplary cross-section of a substrate in a case where the film forming processing is performed using a mixed gas of nitrogen ($N_2$) gas and argon (Ar) gas.

Next, a test was performed in which a silicon nitride film was performed on a base film by using DCS as the precursor gas and using a mixed gas of nitrogen gas and an inert gas only as the reaction gas. The nitrogen gas is an example of the gas of nitride species having no hydrogen atom. In the test, argon gas was used as the inert gas. Further, DCS was used as the precursor gas. FIG. 9 is a schematic view illustrating an exemplary cross-section of a substrate in a case where the film forming processing is performed using a mixed gas of nitrogen gas and argon gas.

In the film forming processing of the silicon nitride film in the test, similarly to the substrate W illustrated in FIG. 8A, a substrate W formed with a base film 101 having a thickness of about 62.4 nm was used. When the film forming processing was performed using the mixture gas of nitrogen gas and argon gas as the reaction gas, a silicon nitride film 102 having a thickness of about 20.1 nm was formed on a base film 101, as illustrated in FIG. 9. Since the silicon nitride film 102 was formed, a conductor film 103 was formed on the silicon nitride film 102.

In the test, as illustrated in FIG. 9, the thickness of the base film 101 after the film forming processing was decreased from about 62.4 nm to about 55.4 nm. However, the decrement in the film thickness of the base film 101 is much smaller than that in the case where the film forming processing was performed using the mixture gas of ammonia gas and hydrogen gas, or in the case where the film forming processing was performed using ammonia gas only. Further, in the test, no cavity was observed inside the base film 101. In addition, no cavity was observed between the base film 101 and the base substrate 100. Thus, it is considered that adhesion between the base film 101 and the base substrate 100 was also maintained.

It has been found that the silicon nitride film 102 may be formed on the base film 101 by using the mixed gas of nitrogen gas and argon gas as the reaction gas, and damage to the base film 101 such as, for example, reduction in film thickness of the base film 101 or generation of cavities may be suppressed. Next, a test was performed while changing the flow rate ratio of the nitrogen gas and the argon gas in order to examine a range of conditions that may suppress the damage such as, for example, reduction in film thickness of the base film 101 or generation of cavities.

FIGS. 10A to 10D are schematic views illustrating an exemplary cross-section of a substrate in a case where the film forming processing is performed with changing a flow rate ratio of nitrogen gas and argon gas. Further, in the test illustrated in FIGS. 10A to 10D, similarly to the substrate W illustrated in FIG. 8A, a substrate W formed with a base film 101 having a thickness of about 62.4 was used. In addition, DCS was used as the precursor gas. Further, in the test illustrated in FIGS. 10A to 10D, the temperature of the substrate W in the plasma processing was 300° C., antennae 22a-2 to 22a-3 were used as the antenna that supplies microwaves, the power of microwaves supplied from each antenna 22a was 4.0 kW, and the rotation speed of the placing table 14 was 20 rpm.

Figure 10A:
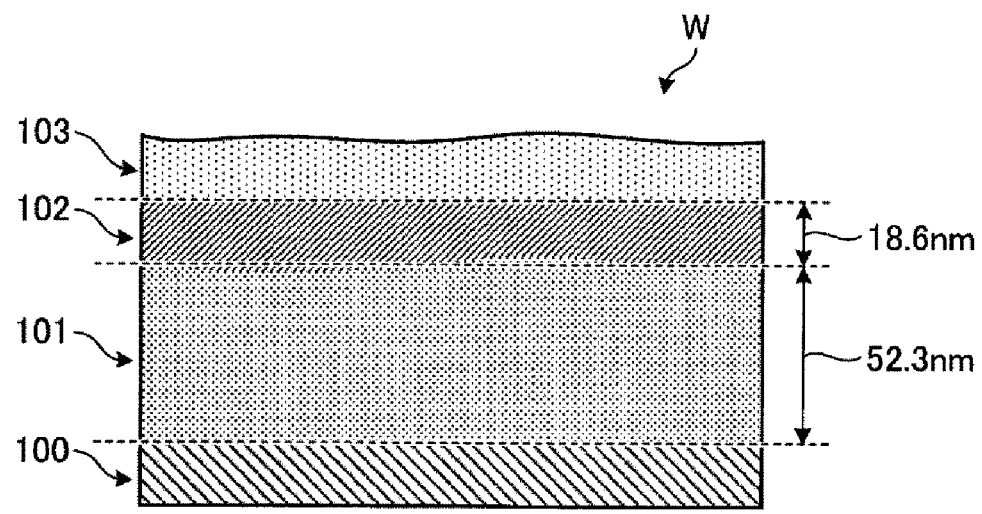
FIG. 10A is a schematic view illustrating an exemplary cross-section of a substrate in a case where the film forming processing is performed using a reaction gas in a flow rate ratio of 20 sccm/5,000 sccm (nitrogen gas/argon gas).

FIG. 10A is a schematic view illustrating an exemplary cross-section of the substrate W in a case where the film forming processing is performed using the reaction gas in a flow rate ratio of 20 sccm/5,000 sccm (nitrogen gas/argon gas). In the test result illustrated in FIG. 10A, a silicon nitride film 102 having a thickness of about 18.6 nm was formed on the base film 101. Further, in the test result illustrated in FIG. 10A, the thickness of the base film 101 after the film forming processing was decreased from about 62.4 nm to about 52.3 nm, but the decrement of the film thickness was small. Further, in the test, no cavity was observed inside the base film 101. In addition, no cavity was observed between the base film 101 and the base substrate 100.

Figure 10B:
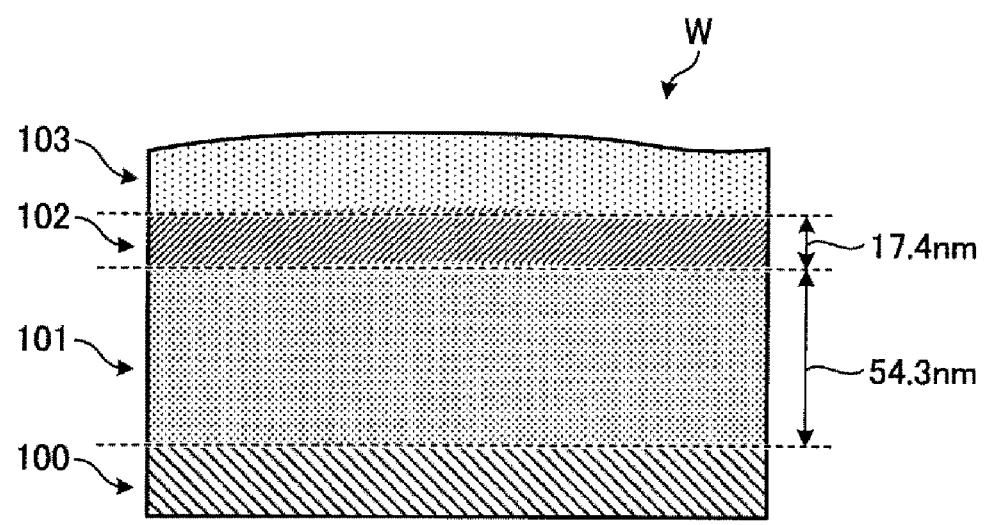
FIG. 10B is a schematic view illustrating an exemplary cross-section of a substrate in a case where the film forming processing is performed using a reaction gas in a flow rate ratio of 20 sccm/3,000 sccm (nitrogen gas/argon gas).

FIG. 10B is a schematic view illustrating an exemplary cross-section of the substrate W in a case where the film forming processing is performed using the reaction gas in a flow rate ratio of 20 sccm/3,000 sccm (nitrogen gas/argon gas). In the test result illustrated in FIG. 10B, a silicon nitride film 102 having a thickness of about 17.4 nm was formed on the base film 101. Further, in the test result illustrated in FIG. 10B, the thickness of the base film 101 after the film forming processing was decreased from about 62.4 nm to about 54.3 nm, but the decrement of the film thickness was small. Further, in the test, no cavity was observed inside the base film 101. In addition, no cavity was observed between the base film 101 and the base substrate 100.

Figure 10C:
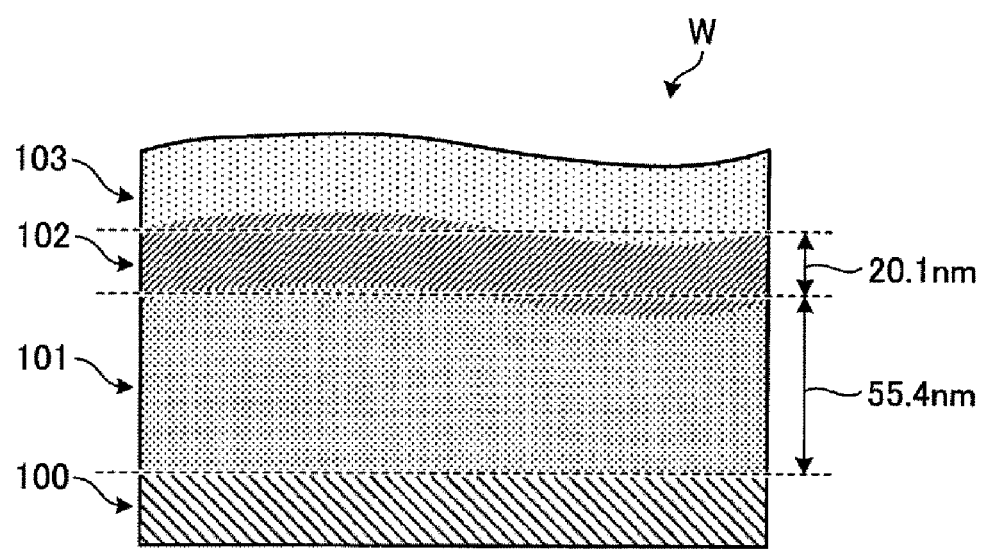
FIG. 10C is a schematic view illustrating an exemplary cross-section of a substrate in a case where the film forming processing is performed using a reaction gas in a flow rate ratio of 20 sccm/1,000 sccm (nitrogen gas/argon gas).

FIG. 10C is a schematic view illustrating an exemplary cross-section of the substrate W in a case where the film forming processing is performed using the reaction gas in a flow rate ratio of 20 sccm/1,000 sccm (nitrogen gas/argon gas). In the test result illustrated in FIG. 10C, a silicon nitride film 102 having a thickness of about 20.1 nm was formed on the base film 101. Further, in the test result illustrated in FIG. 10C, the thickness of the base film 101 after the film forming processing was decreased from about 62.4 nm to about 55.4 nm, but the decrement of the film thickness was small. Further, in the test, no cavity was observed inside the base film 101. In addition, no cavity was observed between the base film 101 and the base substrate 100.

Figure 10D:
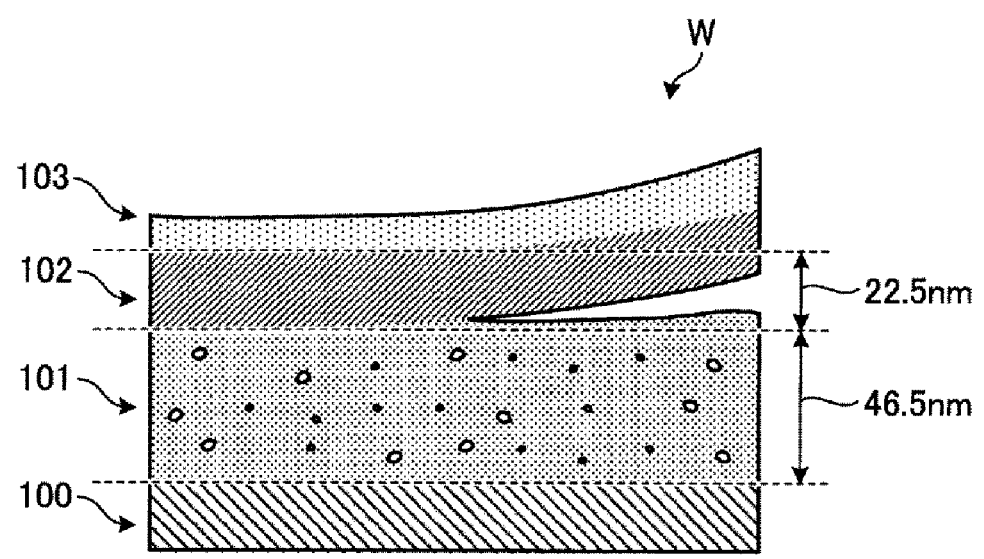
FIG. 10D is a schematic view illustrating an exemplary cross-section of a substrate in a case where the film forming processing is performed using a reaction gas in a flow rate ratio of 1,000 sccm/0 sccm (nitrogen gas/argon gas).

FIG. 10D is a schematic view illustrating an exemplary cross-section of the substrate W in a case where the film forming processing is performed using the reaction gas in a flow rate ratio of 1,000 sccm/0 sccm (nitrogen gas/argon gas). Further, in the test illustrated in FIG. 10D, no argon gas was contained in the reaction gas. In the test result illustrated in FIG. 10D, a silicon nitride film 102 having a thickness of about 22.5 nm was formed on the base film 101. However, in the test result illustrated in FIG. 10D, the thickness of the base film 101 after the film forming processing was decreased from about 62.4 nm to about 46.5 nm, and thus, the decrement of the film thickness was large. Further, as illustrated in FIG. 10D, cavities were generated inside the base film 101, so that a part of the base film 101 was peeled off from the base substrate 100.

FIG. 11 is a table summarizing test results illustrated in FIGS. 10A to 10D. As illustrated in FIG. 11, when the film forming processing is performed using nitrogen gas only as the reaction gas, the decrement of the film thickness of the base film 101 is large. Further, in this case, as illustrated in FIG. 10D, damage such as, for example, cavity generation, occurs inside the base film 101. On the other hand, when the mixed gas of nitrogen gas and argon gas was used as the reaction gas, the decrement of the film thickness of the base film 101 was much smaller than that in the case where the film forming processing was performed using nitrogen gas only as the reaction gas. Further, in this case, as illustrated in FIGS. 10A to 10C, damage such as, for example, cavity generation, was not observed inside the base film 101.

Based on this, it is considered that addition of the inert gas such as, for example, argon gas to the reaction gas increases the plasma density, and thus, the film formation speed of the silicon nitride film 102 is increased, so that the film formation of the silicon nitride film 102 is terminated before the damage to the base film 101 is increased. Accordingly, in order to suppress the damage such as, for example, cavity generation inside the base film 101 by decreasing the decrement of the film thickness of the base film 101, the mixed gas of nitrogen gas and argon gas may be used as the reaction gas. Further, from the test results illustrated in FIGS. 10A to 10D, in order to suppress the damage such as, for example, cavity generation inside the base film 101 by decreasing the decrement of the film thickness of the base film 101, the ratio of the flow rate of the nitrogen gas and the flow rate of the argon gas may be of 20 sccm/1,000 sccm (1/50) or less (nitrogen gas/argon gas).

Further, in an ideal ALD, the film formation speed depends on the substrate rotation speed, but not on the plasma density. However, in practice, when the flow rate of the argon gas is low, the presence probability of nitrogen radicals is reduced. Therefore, assuming that there are 100 sites capable of being nitrified, only 60 sites are nitrified. Consequently, when the flow rate of the argon gas is low, the film formation speed is decreased. When the film formation speed is increased, the probability that the base film and the nitrogen radicals will form C—N bonds is decreased, so that the damage of the base film is decreased.

Next, a test was performed with changing the number of antennae 22a that supply microwaves, and the power of the microwaves supplied from the antennae 22a, and an examination was made on a range of conditions that can suppress the damage such as, for example, reduction in film thickness of the base film 101 or generation of cavities. FIGS. 12A to 12E are schematic views illustrating an exemplary cross-section of a substrate W in a case where the film forming processing is performed by changing the number of antennae and the power of microwaves supplied from the antennae. Further, in the test illustrated in FIGS. 12A to 12D, similarly to the substrate W illustrated in FIG. 8A, a substrate W, in which a base film 101 of about 62.4 nm was formed, was used. In addition, DCS was used as the precursor gas. Further, in the test illustrated in FIGS. 12A to 12D, the temperature of the substrate W in the plasma processing was 300° C., antennae 22a-2 to 22a-3 were used as the antenna that supplies microwaves, the ratio of the flow rate of the nitrogen gas and the flow rate of the argon gas was 20 sccm/1,000 sccm (nitrogen gas/argon gas), and the rotation speed of the placing table 14 was 20 rpm.

Figure 12A:
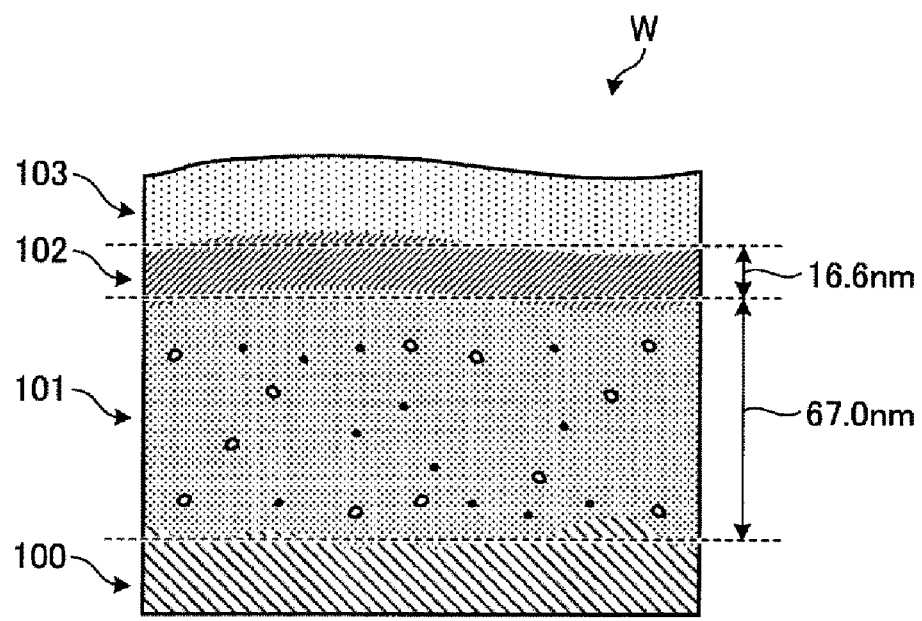
FIG. 12A is a schematic view illustrating an exemplary cross-section of a substrate in a case where the film forming processing is performed by using one antenna and setting a power of microwaves supplied from the antenna to 0.5 kW.

FIG. 12A is a schematic view illustrating an exemplary cross-section of the substrate W in a case where the film forming processing is performed by using one antenna 22a (the antenna 22a-3) and setting a power of microwaves supplied from the antenna to 0.5 kW. Further, in the test illustrated in FIG. 12A, the antennae 22a-1 and 22a-2 were unused. In the test result illustrated in FIG. 12A, a silicon nitride film 102 having a thickness of about 16.6 nm was formed on the base film 101.

However, in the test result illustrated in FIG. 12A, cavities were generated inside the base film 101 after the film forming processing, and as a result, the thickness of the base film 101 is expanded from about 62.4 nm to about 67.0 nm. Further, it is considered that since cavities were observed between the base film 101 and the base substrate 100, the adhesion between the base film 101 and the base substrate 100 was lowered.

Figure 12B:
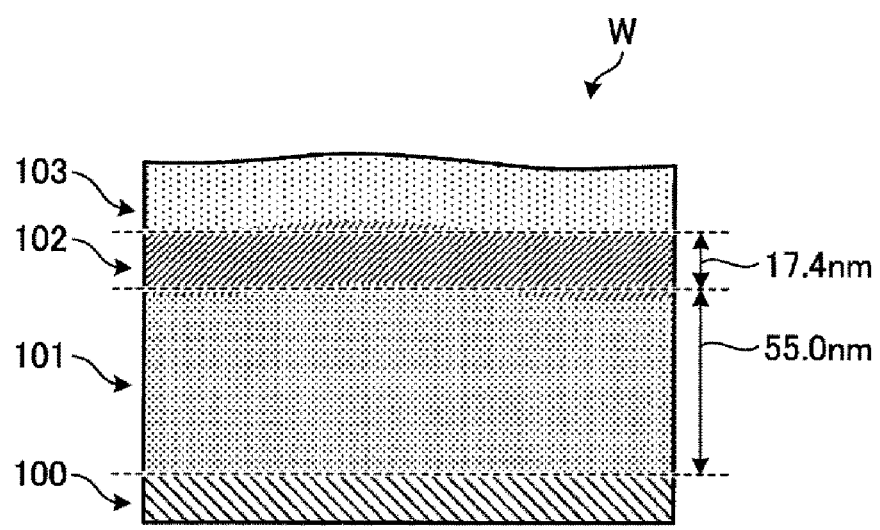
FIG. 12B is a schematic view illustrating an exemplary cross-section of a substrate in a case where the film forming processing is performed by using two antennae and setting a power of microwaves supplied from each antenna to 1.0 kW.

FIG. 12B is a schematic view illustrating an exemplary cross-section of the substrate W in a case where the film forming processing is performed by using two antennae 22a (the antennae 22a-2 and 22a-3) and setting a power of microwaves supplied from each antenna to 1.0 kW. In the test, the sum of the power of the microwaves supplied from the antennae 22a was 2.0 kW. Further, in the test illustrated in FIG. 12B, the antenna 22a-1 was unused.

In the test result illustrated in FIG. 12B, a silicon nitride 102 having a thickness of about 17.4 nm was formed on the base film 101. Further, in the test result illustrated in FIG. 12B, the thickness of the base film 101 after the film forming processing was decreased from about 62.4 nm to about 55.0 nm, but the decrement of the film thickness was small. Further, in the test, no cavity was observed inside the base film 101. In addition, no cavity was observed between the base film 101 and the base substrate 100.

Figure 12C:
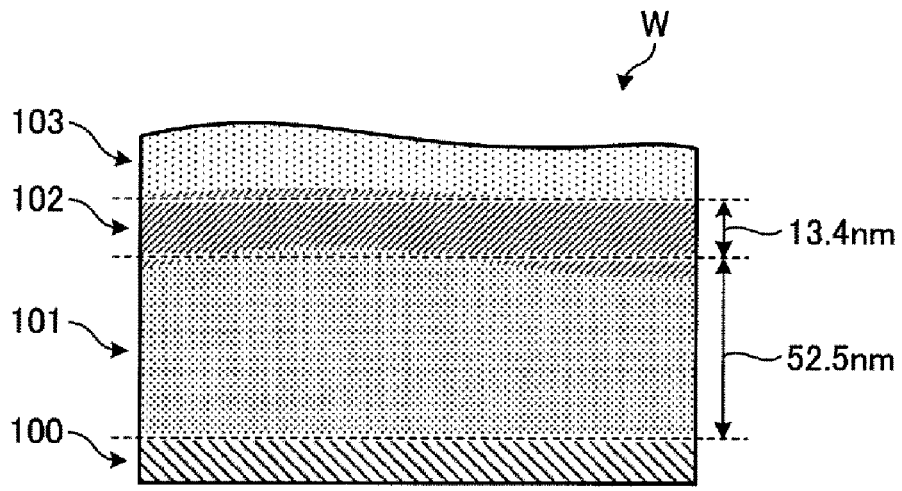
FIG. 12C is a schematic view illustrating an exemplary cross-section of a substrate in a case where the film forming processing is performed by using one antenna and setting a power of microwaves supplied from the antenna to 2.0 kW.

FIG. 12C is a schematic view illustrating an exemplary cross-section of the substrate W in a case where the film forming processing is performed by using one antenna 22a (the antenna 22a-3) and setting a power of microwaves supplied from the antenna to 2.0 kW. Further, in the test illustrated in FIG. 12C, the antennae 22a-1 and 22a-2 were unused.

In the test result illustrated in FIG. 12C, a silicon nitride 102 having a thickness of about 13.4 nm was formed on the base film 101. Further, in the test result illustrated in FIG. 12C, the thickness of the base film 101 after the film forming processing was decreased from about 62.4 nm to about 52.5 nm, but the decrement of the film thickness was small. Further, in the test, no cavity was observed inside the base film 101. In addition, no cavity was observed between the base film 101 and the base substrate 100.

Figure 12D:
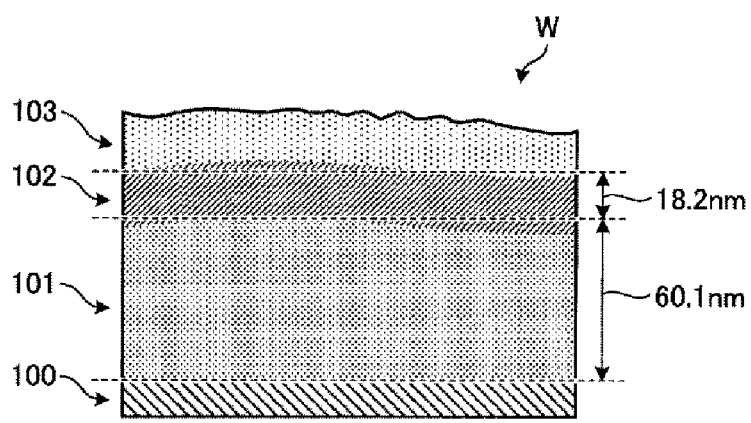
FIG. 12D is a schematic view illustrating an exemplary cross-section of a substrate in a case where the film forming processing is performed by using two antennae and setting a power of microwaves supplied from each antenna to 2.0 kW.

FIG. 12D is a schematic view illustrating an exemplary cross-section of the substrate W in a case where the film forming processing is performed by using two antennae 22a (the antennae 22a-2 and 22a-3) and setting a power of microwaves supplied from each antenna to 2.0 kW. In the test, the sum of the power of the microwaves supplied from the antennae 22a was 4.0 kW. Further, in the test illustrated in FIG. 12D, the antenna 22a-1 was unused.

In the test result illustrated in FIG. 12D, a silicon nitride 102 having a thickness of about 18.2 nm was formed on the base film 101. Further, in the test result illustrated in FIG. 12D, the thickness of the base film 101 after the film forming processing was decreased from about 62.4 nm to about 60.1 nm, but the decrement of the film thickness was small. Further, in the test, no cavity was observed inside the base film 101. In addition, no cavity was observed between the base film 101 and the base substrate 100.

Figure 12E:
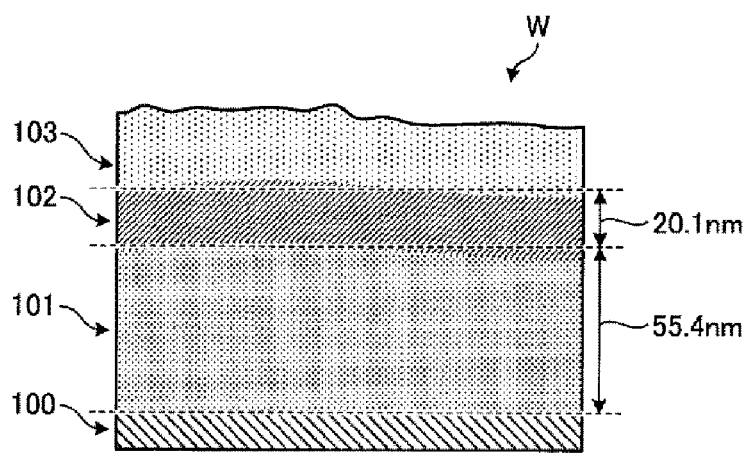
FIG. 12E is a schematic view illustrating an exemplary cross-section of a substrate in a case where the film forming processing is performed by using two antennae and setting a power of microwaves supplied from each antenna to 4.0 kW.

FIG. 12E is a schematic view illustrating an exemplary cross-section of the substrate W in a case where the film forming processing is performed by using two antennae 22a (the antennae 22a-2 and 22a-3) and setting a power of microwaves supplied from each antenna to 4.0 kW. In the test, the sum of the power of the microwaves supplied from the antennae 22a was 8.0 kW. Further, in the test illustrated in FIG. 12E, the antenna 22a-1 was unused.

In the test result illustrated in FIG. 12E, a silicon nitride 102 having a thickness of about 20.1 nm was formed on the base film 101. Further, in the test result illustrated in FIG. 12E, the thickness of the base film 101 after the film forming processing was decreased from about 62.4 nm to about 55.4 nm, but the decrement of the film thickness was small. Further, in the test, no cavity was observed inside the base film 101. In addition, no cavity was observed between the base film 101 and the base substrate 100.

FIG. 13 is a table summarizing test results illustrated in FIGS. 12A to 12E. As illustrated in FIG. 13, when the sum of the power of the microwaves supplied from the antennae 22a is 0.5 kW, the base film 101 is degenerated, so that damage such as, for example, cavity generation, occurs inside the base film 101. On the other hand, when the sum of the power of the microwaves supplied from the antennae 22a is 2.0 kW or more, degeneration of the base film 101 or damage such as, for example, cavity generation, was not observed.

It is considered that, when the power of the supplied microwaves is low, the molecules of the nitrogen gas is not sufficiently dissociated, so that the number of ions or radicals of the nitrogen atoms contained in the plasma is decreased. Thus, the film formation speed is decreased, so that the substrate W including the base film 101 is exposed to a high-temperature environment for a long period of time until the silicon nitride film 102 is formed in a predetermined thickness. Accordingly, it is considered that the base film 101 is degenerated due to the thermal affection.

On the other hand, it is considered that, when the sum of the power of the microwaves supplied from the antennae 22a is, for example, 2.0 kW or more, the number of molecules of the nitrogen gas dissociated in the plasma is increased, so that the number of ions or radicals of the nitrogen atoms contained in the plasma is increased. Thus, the film formation speed is increased, so that the time required to form the silicon nitride film 102 in a predetermined thickness is reduced. Accordingly, it is considered that the time when the substrate W including the base film 101 is exposed to a high-temperature environment is reduced, and thus, thermal affection on the base film 101 is reduced, thereby suppressing degeneration of the base film 101.

Accordingly, in order to form the silicon nitride film 102 having a predetermined thickness on the base film 101 while suppressing degeneration of the base film 101, the sum of the power of the microwaves supplied from the antennae 22a may be, for example, 2.0 kW or more.

Figure 14:
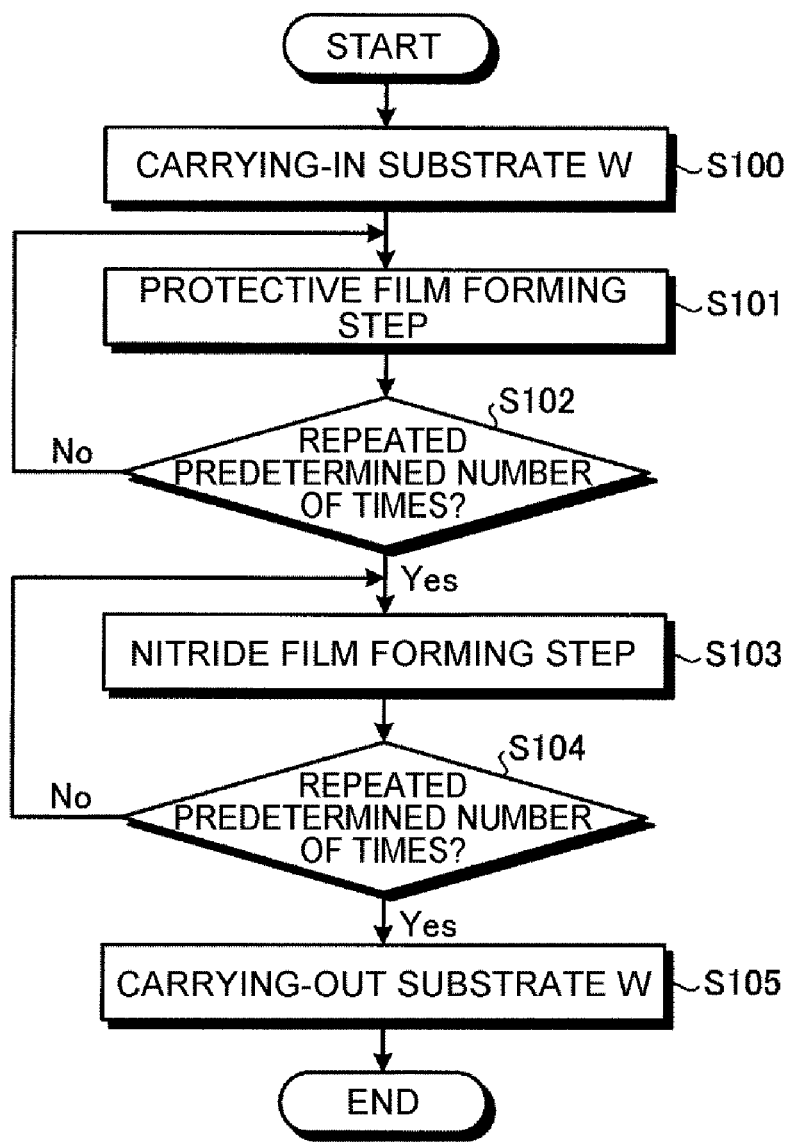
FIG. 14 is a flowchart illustrating an exemplary film forming processing of forming a silicon nitride film after forming a protective film.

Next, a test was performed in which a silicon nitride film (a first nitride film) having a predetermined thickness was formed on a base film 101 by plasma of a mixed gas of nitrogen gas and argon gas, and the first nitride film was used as a protective film, on which a silicon nitride film (a second nitride film) was formed by plasma of a mixed gas of ammonia gas and hydrogen gas. FIG. 14 is a flowchart illustrating an exemplary film forming processing of forming a silicon nitride film after forming a protective film.

First, a substrate W formed with a base film 101 formed on a base substrate 100 is carried into the processing container 12 of the film forming apparatus 10 (S100). Then, a protective film forming step is performed (S101). In the protective film forming step, DCS gas serving as a precursor gas is injected from the first gas supply section 16 onto the substrate W that is moving by the rotation of the placing table 14. Then, the precursor gas excessively adsorbed on the surface of the substrate W is removed from the substrate W by the actions of the exhaust section 18 and the second gas supply section 20. Then, the substrate W that is moving by the rotation of the placing table 14 is exposed to plasma of a mixed gas of nitrogen gas and argon gas, which is supplied as a reaction gas from the reaction gas supply section 22c. Therefore, a protective film is formed on the base film 101.

Further, in the protective film forming step, a ratio of the flow rate of the nitrogen gas and the flow rate of the argon gas is 20 sccm/1,000 sccm (nitrogen gas/argon gas), two antennae 22a (the antennae 22a-2 and 22a-3) are used, and the power of microwaves supplied from each antenna 22a is 2.0 kW. In addition, the temperature of the substrate W in the plasma processing is 300° C., and the rotation speed of the placing table 14 was 20 rpm.

Then, until a protective film having a predetermined thickness is formed on the base film 101 (S102: No), the protective film forming step illustrated as step S101 is repeated a predetermined number of times. In the test, until a protective film having a thickness of, for example, about 3 nm is formed, the protective film forming step illustrated as step S101 is repeated. When the protective film forming step is repeated the predetermined number of times (S102: Yes), a nitride film forming step is performed (S103).

In the nitride film forming step, DCS gas serving as a precursor gas is injected from the first gas supply section 16 onto the substrate W that is moving by the rotation of the placing table 14. Then, the precursor gas excessively adsorbed on the substrate W is removed from the substrate W by the actions of the exhaust section 18 and the second gas supply section 20. Then, the substrate W that is moving by the rotation of the placing table 14 is exposed to plasma of a mixed gas of ammonia gas and hydrogen gas, which is supplied as a reaction gas from the reaction gas supply section 22c. Therefore, a silicon nitride film is formed on the protective film.

Further, in the nitride film forming step, a ratio of the flow rate of the ammonia gas and the flow rate of the hydrogen gas is 750 sccm/4,000 sccm (ammonia gas/hydrogen gas), two antennae 22a (the antennae 22a-2 and 22a-3) are used, and the power of microwaves supplied from each antenna 22a is 4.0 kW. In addition, the temperature of the substrate W in the plasma processing is 300° C., and the rotation speed of the placing table 14 was 20 rpm.

Then, until a silicon nitride film having a predetermined thickness is formed on the protective film (S104: No), the nitride film forming step illustrated as step S103 is repeated a predetermined number of times. In the test, until a silicon nitride film having a thickness of, for example, about 17 nm is formed, the protective film forming step illustrated as step S103 is repeated. When the nitride film forming step is repeated the predetermined number of times (S104: Yes), the substrate W is carried out from the processing container 12 (S105), and the film forming processing illustrated in the flowchart is terminated.

Figure 15:
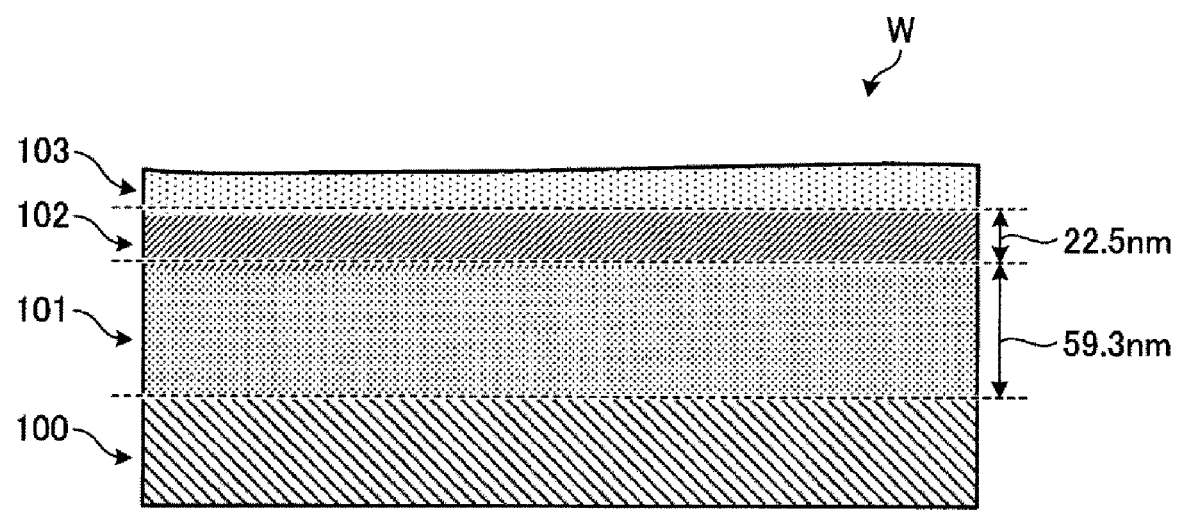
FIG. 15 is a schematic view illustrating an exemplary cross-section of a substrate in a case where the silicon nitride film is formed after the protective film is formed using a mixed gas of nitrogen gas and argon gas.

FIG. 15 is a schematic view illustrating an exemplary cross-section of the substrate that is subjected to the film forming processing illustrated in FIG. 14. The substrate W illustrated in FIG. 15 includes the silicon nitride film 102 having a film thickness of about 22.5 nm formed on the base film 101. The silicon nitride film 102 illustrated in FIG. 15 includes the protective film formed by plasma of the mixed gas of nitrogen gas and argon gas, and the silicon nitride film formed by plasma of the mixed gas of ammonia gas and hydrogen gas.

In the test, a substrate W formed with a base film 101 having a film thickness of about 60 nm was used. As illustrated in FIG. 15, the thickness of the base film 101 after the film forming processing was about 59.3 nm, which was not substantially changed from that of the base film 101 before the film formation. Further, in the test, no cavity was observed inside the base film 101. In addition, no cavity was observed between the base film 101 and the base substrate 100. Further, no degeneration of the base film 101 was observed.

Moreover, as a result of having repeated the test, it has been found that, even though the thickness of the protective film formed by the plasma of the mixed gas of nitrogen gas and argon gas is decreased to 0.5 nm to 1.0 nm, the protective film functions as a protective film of the base film 101, and is able to suppress generation of cavities in the base film 101. An object of the test is to form a silicon nitride film on the carbon-containing base film 101 by plasma of a mixed gas of ammonia gas and hydrogen gas. The protective film formed by the plasma of the mixed gas of nitrogen gas and argon gas has a different property from that of the silicon nitride film formed by the plasma of the mixed gas of ammonia gas and hydrogen gas. Thus, the protective film may be as thin as possible. Therefore, the thickness of the protective film may be 0.5 nm to 1.0 nm.

An exemplary embodiment has been described. According to the film forming apparatus 10 of the exemplary embodiment, it is possible to form a nitride film having a predetermined thickness on the base film while suppressing a decrease in film thickness of a carbon atom-containing base film.

Further, the present disclosure is not limited to the exemplary embodiment described above, but various modifications may be made within the scope of the present disclosure.

For example, in the exemplary embodiment described above, the silicon nitride film formed on the protective film is formed by the plasma of the mixed gas of ammonia gas and hydrogen gas, but the present disclosure is not limited thereto. The silicon nitride film may be formed by, for example, plasma of a mixed gas of nitrogen gas and hydrogen gas. If the silicon nitride film is formed on the base film by the plasma of the mixture gas of nitrogen gas and hydrogen gas without providing a protective film, the decrement in film thickness of the carbon atom-containing base film is increased due to the hydrogen atoms contained in the plasma. However, when the silicon nitride film is formed, by the plasma of the mixed gas of nitrogen gas and hydrogen gas, on the protective film formed on the base film, it is possible to form a nitride film having a predetermined thickness on the base film while suppressing a decrease in film thickness of the base film.

In the exemplary embodiment described above, a film forming apparatus 10 was described with respect to the semi-batch type film forming apparatus 10 using microwaves, but the film forming apparatus 10 is not limited thereto. For example, the film forming apparatus 10 may be a single wafer type or batch type film forming apparatus as a film forming apparatus of the ALD method using plasma of microwaves, or a film forming apparatus of a chemical vapor deposition (CVD) method using high frequency waves.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of forming a nitride film on a substrate, the method comprising:
preparing a processing target substrate having a carbon-containing film that contains a carbon atom;
placing the processing target substrate within a processing container of a film forming apparatus;
forming a first nitride film on the carbon-containing film by an atomic layer deposition (ALD) method, using a first mixed-gas plasma of nitrogen ($N_2$) and argon (Ar) that does not contain any hydrogen species, wherein the first mixed-gas plasma is generated by microwaves of 2 kW or more in total power that are supplied from an antenna placed in the processing container;
forming a second nitride film on the first nitride film by a second mixed-gas plasma of ammonia ($NH_3$) and hydrogen ($H_2$) only; and
forming a conductor film on the second nitride film.

2. The method of claim 1, wherein the first nitride film is formed on the carbon-containing film in a thickness of 0.5 nm to 1.0 nm.

3. The method of claim 1, wherein the second nitride film is formed by a method other than the ALD method.

4. A method of forming a nitride film on a substrate, the method comprising:
preparing a processing target substrate having a carbon-containing film that contains a carbon atom;
placing the processing target substrate within a processing container of a film forming apparatus;
forming a first nitride film on the carbon-containing film by a first mixed-gas plasma of nitrogen ($N_2$) and argon (Ar), the first mixed-gas plasma not containing any hydrogen species;
forming a second nitride film on the first nitride film by a second mixed-gas plasma of ammonia ($NH_3$) and hydrogen ($H_2$) only; and
forming a conductor film on the second nitride film,
wherein the processing container is divided into a plurality of regions in a circumferential direction where the processing target substrate is moved around an axis by rotating a placing table on which the processing target substrate is placed, the placing table being provided to be rotatable around the axis such that the processing target substrate is moved around the axis,
the forming the first nitride film includes:
supplying a precursor gas to one of the plurality of regions so that a molecule of the precursor gas is adsorbed onto a surface of the processing target substrate;
supplying a gaseous nitrogen ($N_2$) and argon (Ar) mixture to another region among the plurality of regions;
generating the first mixed-gas plasma of the nitrogen ($N_2$) and argon (Ar) mixture by microwaves supplied to the another region; and
performing a plasma processing, by the generated first mixed-gas plasma, on the surface of the processing target substrate onto which the molecule of the precursor gas is adsorbed, and
the forming the second nitride film includes:
supplying the precursor gas into the processing container in the one region so that the molecule of the precursor gas is adsorbed onto the surface of the processing target substrate;
supplying a gaseous ammonia ($NH_3$) and hydrogen ($H_2$) mixture into the another region;
generating the second mixed-gas plasma of the ammonia ($NH_3$) and hydrogen ($H_2$) mixture by microwaves supplied to the another region; and
performing a plasma processing, by the generated plasma, on the surface of the processing target substrate onto which the molecule of the precursor gas is adsorbed,
wherein the first nitride film is formed by an atomic layer deposition (ALD) method.

* * * * *